(12) United States Patent
Sugiyama et al.

(10) Patent No.: US 10,960,426 B2
(45) Date of Patent: Mar. 30, 2021

(54) DEVELOPMENT PROCESSING DEVICE

(71) Applicant: SCREEN Semiconductor Solutions Co., Ltd., Kyoto (JP)

(72) Inventors: Minoru Sugiyama, Kyoto (JP); Mitsuru Asano, Kyoto (JP); Fumiya Okazaki, Kyoto (JP)

(73) Assignee: SCREEN Semiconductor Solutions Co., Ltd.

( * ) Notice: Subject to any disclaimer, the term of this patent is extended or adjusted under 35 U.S.C. 154(b) by 144 days.

(21) Appl. No.: 15/895,676

(22) Filed: Feb. 13, 2018

(65) Prior Publication Data

US 2018/0164736 A1 Jun. 14, 2018

Related U.S. Application Data

(62) Division of application No. 13/895,698, filed on May 16, 2013, now Pat. No. 9,927,760.

(30) Foreign Application Priority Data

May 22, 2012 (JP) .................................. 2012-116318
May 22, 2012 (JP) .................................. 2012-116319

(51) Int. Cl.
*B05B 15/55* (2018.01)
*B05B 15/555* (2018.01)
(Continued)

(52) U.S. Cl.
CPC .......... *B05B 15/557* (2018.02); *B05B 15/555* (2018.02); *B08B 3/102* (2013.01); *B05C 5/0254* (2013.01); *H01L 21/6715* (2013.01)

(58) Field of Classification Search
None
See application file for complete search history.

(56) References Cited

U.S. PATENT DOCUMENTS

| 2001/0004878 A1 | 6/2001 | Sakai ............................ 118/70 |
| 2003/0216053 A1 | 11/2003 | Miyata ........................ 438/758 |

(Continued)

FOREIGN PATENT DOCUMENTS

| JP | H0592158 A | 4/1993 |
| JP | 09-122553 A | 5/1997 |

(Continued)

OTHER PUBLICATIONS

English Machine Translation of WO 2007/111055.*
English Machine Translation of JP 2004-113934.*

*Primary Examiner* — Nicole Blan
(74) *Attorney, Agent, or Firm* — Ostrolenk Faber LLP

(57) ABSTRACT

A slit nozzle is moved by a nozzle lifting/lowering mechanism and a nozzle sliding mechanism relative to substrates held in a substantially horizontal attitude by spin chucks. A development liquid is discharged on each substrate from a discharge port of the slit nozzle such that development processing for the substrate is performed. After the development liquid is discharged, the slit nozzle is moved to a waiting position excluding positions over the substrates held by the spin chucks. In waiting pods provided at the waiting positions, cleaning processing for the slit nozzle is performed by a cleaning liquid with gas bubbles mixed therein.

10 Claims, 14 Drawing Sheets

(51) Int. Cl.
  *B08B 3/10* (2006.01)
  *B05C 5/02* (2006.01)
  *H01L 21/67* (2006.01)

(56) References Cited

U.S. PATENT DOCUMENTS

| | | | |
|---|---|---|---|
| 2004/0213913 A1 | 10/2004 | Jung | 427/420 |
| 2005/0191051 A1 | 9/2005 | Miyata | 396/611 |
| 2005/0283993 A1* | 12/2005 | Wu | B08B 3/102 34/443 |
| 2006/0147620 A1 | 7/2006 | Kwon | 427/162 |
| 2008/0018867 A1* | 1/2008 | Fujiwara | G03F 7/70341 355/30 |
| 2012/0115090 A1 | 5/2012 | Takeguchi et al. | 430/435 |
| 2013/0118533 A1 | 5/2013 | Takiguchi et al. | 134/26 |

FOREIGN PATENT DOCUMENTS

| | | |
|---|---|---|
| JP | 09-152717 | 6/1997 |
| JP | 09-232212 | 9/1997 |
| JP | 10098017 A | 4/1998 |
| JP | 10-216598 A | 8/1998 |
| JP | 2000-012416 A | 1/2000 |
| JP | 2000-061377 A | 2/2000 |
| JP | 2001-319869 | 11/2001 |
| JP | 2002-355596 | 12/2002 |
| JP | 2003-324059 A | 11/2003 |
| JP | 2004-039727 A | 2/2004 |
| JP | 2004-113934 A | 4/2004 |
| JP | 2005262127 A | 9/2005 |
| JP | 2005-324123 A | 11/2005 |
| JP | 2006-051504 A | 2/2006 |
| JP | 2006-281101 A | 10/2006 |
| JP | 2007-149891 A | 6/2007 |
| JP | 2007-253093 A | 10/2007 |
| JP | 2007-258462 A | 10/2007 |
| JP | 2007-294907 A | 11/2007 |
| JP | 2010-087323 | 4/2010 |
| JP | 2010-186974 | 8/2010 |
| JP | 2010-250157 | 11/2010 |
| JP | 2011-167612 A | 9/2011 |
| JP | 2012-28571 A | 2/2012 |
| JP | 2012-043836 | 3/2012 |
| JP | 2012-060137 | 3/2012 |
| JP | 2012-070002 A | 4/2012 |
| KR | 100708314 B1 | 4/2007 |
| KR | 1020070036865 A | 4/2007 |
| KR | 1020080110007 A | 12/2008 |
| TW | 201143913 A1 | 12/2011 |
| TW | 201220385 A1 | 5/2012 |
| WO | WO 2007/111055 A1 | 10/2007 |

* cited by examiner

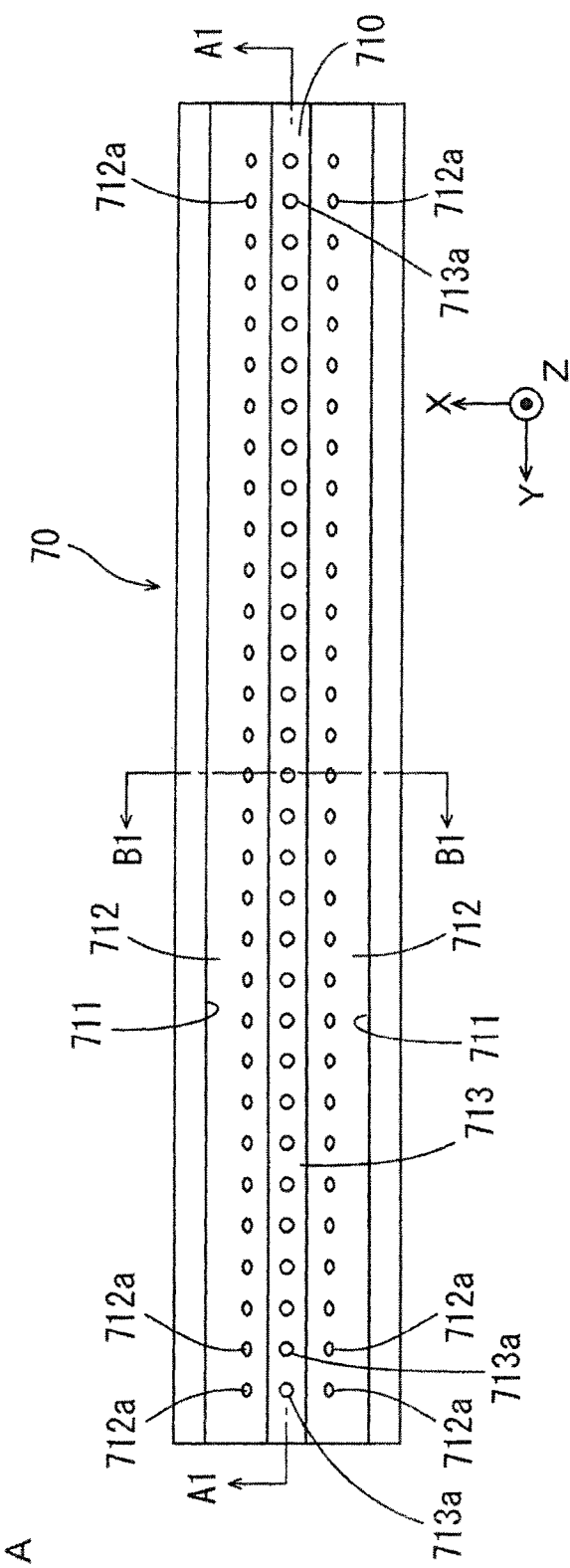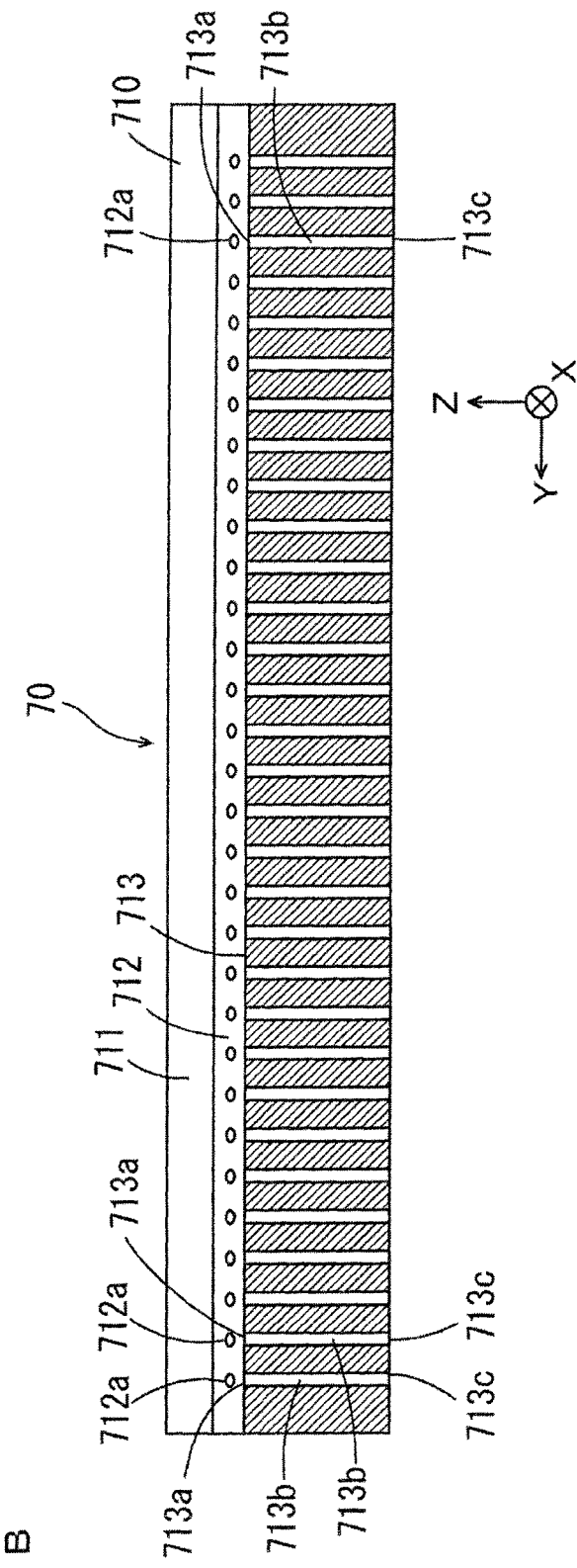

F I G. 1 2
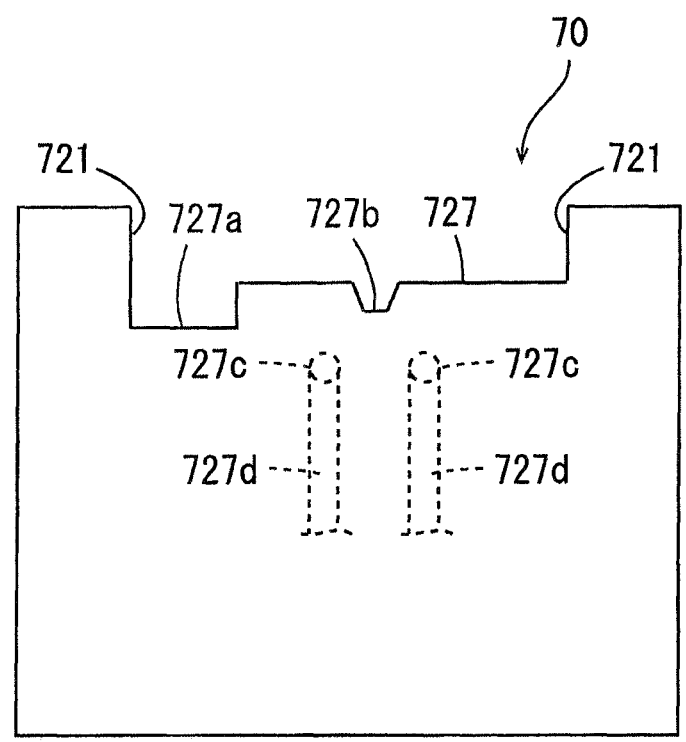
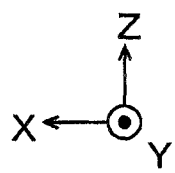

DEVELOPMENT PROCESSING DEVICE

CROSS-REFERENCE TO RELATED APPLICATIONS

This application is a divisional of U.S. patent application Ser. No. 13/895,698, filed May 16, 2013, which claims the benefit of Japanese Patent Application Nos. JP 2012-116318, filed May 22, 2012 and JP 2012-116319, filed May 22, 2012, the contents of which are incorporated herein by reference.

BACKGROUND OF INVENTION

(1) Field of the Invention

The present invention relates to a development processing device that performs development processing on a substrate.

(2) Description of Related Art

A conventional development processing device includes a development liquid nozzle having a slit-shaped discharge port, for example. The development liquid nozzle is moved in one direction over a substrate held in a stationary state while discharging a development liquid. This causes a liquid layer of the development liquid to be formed on the substrate, whereby development reaction progresses. The development liquid nozzle waits at a waiting pod while not discharging the development liquid. (see JP 2010-87323 A, for example)

BRIEF SUMMARY OF THE INVENTION

If the development liquid is adhering to the development liquid nozzle after the development liquid is discharged on the substrate, the development liquid may drop on the substrate and development defects may occur. Further, foreign matters such as a resist residue may adhere to the development liquid nozzle. Also in this case, the development defects may occur due to a reason such as the foreign matters drop on the substrate, the development liquid cannot be appropriately discharged on the substrate or the like. Therefore, the development liquid nozzle needs to be cleaned after the development liquid is discharged.

One object of the present invention is to provide a development processing device that is capable of cleaning a development liquid nozzle.

Further, it is conceivable that the development nozzle is cleaned in the waiting pod using a cleaning liquid after the development liquid is discharged from the development liquid nozzle. However, when the development liquid nozzle is moved to a position over the substrate after the development liquid nozzle is cleaned, the cleaning liquid may drop on the substrate from the development liquid nozzle. Also in that case, the development defects of the substrate may occur.

The other object of the present invention is to provide a development processing device in which development defects of a substrate is prevented.

(1) According to one aspect of the present invention, a development processing device includes a substrate holder that holds a substrate in a substantially horizontal attitude, a development liquid nozzle having a development liquid discharge port for discharging a development liquid, a cleaning processor, provided at a waiting position excluding a position over the substrate held by the substrate holder, that performs cleaning processing for the development liquid nozzle and a moving device that moves the development liquid nozzle relative to the substrate held by the substrate holder, and moves the development liquid nozzle to the waiting position after the development liquid is discharged by the development liquid nozzle on the substrate held by the substrate holder, wherein the cleaning processor is configured to perform the cleaning processing for the development liquid nozzle using a cleaning liquid in which gas bubbles are mixed.

In the development processing device, the development liquid nozzle is moved by the moving device relative to the substrate held in a substantially horizontal attitude by the substrate holder. The development liquid is discharged on the substrate from the development liquid discharge port of the development liquid nozzle such that the development processing for the substrate is performed. After the development liquid is discharged, the development liquid nozzle is moved by the moving device to the waiting position excluding the position over the substrate held by the substrate holder. In the cleaning processor provided at the waiting position, the cleaning processing for the development liquid nozzle is performed using the cleaning liquid with the gas bubbles mixed therein.

In this case, the gas bubbles in the cleaning liquid collide with the development liquid nozzle. Contaminants adhering to the development liquid nozzle are removed by its colliding forces. Further, the contaminants adhering to the development liquid nozzle are broken up by the pressure wave generated by the movement, collision and the like of the gas bubbles. Further, the gas bubbles adhere to the contaminants and strips the contaminants off the development liquid nozzle.

Further, the plurality of gas bubbles move dispersively in different directions by repeating to collide, burst and unite. Thus, the entire development liquid nozzle can be uniformly cleaned.

Thus, the development liquid nozzle can be cleaned. As a result, the development defects of the substrate caused by the contamination of the development liquid nozzle can be prevented.

(2) The cleaning processor may include a gas bubbles mixer that mixes the gas bubbles in the cleaning liquid, and a cleaning liquid supplier having a cleaning liquid discharge port for discharging the cleaning liquid in which the gas bubbles are mixed by the gas bubbles mixer.

In this case, the cleaning liquid with the gas bubbles mixed therein is discharged on the development liquid nozzle from the cleaning liquid discharge port. Thus, the gas bubbles can efficiently collide with the development liquid nozzle. Therefore, the development liquid nozzle can be efficiently cleaned.

(3) The cleaning liquid supplier may have a container capable of containing at least part of the development liquid nozzle including the development liquid discharge port, and the cleaning liquid discharge port may be provided in the container.

In this case, the cleaning liquid with the gas bubbles mixed therein is discharged from the cleaning liquid discharge port provided in the container while part of the development liquid nozzle including at least the development liquid discharge port is contained in the container. Thus, the development liquid discharge port of the development liquid nozzle and its vicinity can be cleaned.

(4) The development liquid nozzle may have a lower surface extending in one direction, the development liquid discharge port may be provided at the lower surface to extend in the one direction, the container may include a groove extending in the one direction and capable of containing at least the lower surface of the development liquid nozzle, the groove may have an inner surface extending in the one direction and the cleaning liquid discharge port may be provided at the inner surface of the groove.

In this case, the cleaning liquid with the gas bubbles mixed therein is discharged from the cleaning liquid discharge port provided at the inner surface of the groove while the lower surface of the development liquid nozzle provided with the development liquid discharge port is contained in the groove. Thus, the lower surface of the development liquid nozzle can be cleaned.

(5) The cleaning liquid discharge port may include a plurality of openings provided to be arranged in the one direction.

In this case, the cleaning liquid with the gas bubbles mixed therein can be efficiently supplied to the entire lower surface of the development liquid nozzle. Thus, the entire lower surface of the development liquid nozzle can be efficiently cleaned.

(6) An outflow portion from which the cleaning liquid discharged from the cleaning liquid discharge port can flow out may be provided at least one end of the groove.

In this case, the cleaning liquid with the gas bubbles mixed therein flows in one direction in the groove. This enables the cleaning liquid with the gas bubbles mixed therein to come into contact with the lower surface of the development liquid nozzle. Therefore, the entire lower surface of the development liquid nozzle can be efficiently cleaned.

(7) A drain port for draining the cleaning liquid discharged from the cleaning liquid discharge port may be provided at the inner surface of the groove.

In this case, the contaminants removed from the development liquid nozzle can be drained together with the cleaning liquid through the drain port. Thus, the removed contaminants can be prevented from adhering again to the development liquid nozzle.

(8) The cleaning processor may further include a suction device that sucks in the cleaning liquid discharged from the cleaning liquid discharge port through the drain port.

In this case, the cleaning liquid and the removed contaminants can be more efficiently drained through the drain port. Thus, the removed contaminants can be more reliably prevented from adhering again to the development liquid nozzle.

(9) The cleaning processor may include a storage capable of containing at least part of the development liquid nozzle including the development liquid discharge port and storing the cleaning liquid, and a gas bubbles mixer that mixes gas bubbles in the cleaning liquid stored in the storage.

In this case, the cleaning liquid is stored in the storage while part of the development liquid nozzle including at least the development liquid discharge port is contained in the storage, and the gas bubbles are mixed in the stored cleaning liquid. This keeps part of the development liquid nozzle including at least development liquid discharge port to be dipped in the cleaning liquid with the gas bubbles mixed therein, whereby the contaminants adhering to the development liquid discharge port and its vicinity can be effectively removed. Therefore, the development liquid discharge port of the development liquid nozzle and its vicinity can be cleaned.

(10) The development liquid nozzle may have a lower surface extending in one direction, the development liquid discharge port may be provided at the lower surface to extend in the one direction, the container may include a groove extending in the one direction and capable of containing at least the lower surface of the development liquid nozzle, the groove may have an inner surface extending in the one direction and a cleaning liquid discharge port for discharging the cleaning liquid and a gas discharge port for discharging gas may be provided at the inner surface of the groove.

In this case, the cleaning liquid is discharged from the cleaning liquid discharge port provided at the inner surface of the groove while the lower surface of the development liquid nozzle provided with the development liquid discharge port is contained in the groove, whereby the cleaning liquid is stored in the groove. Further, the gas is discharged from the gas discharge port provided at the inner surface of the groove such that the gas bubbles are mixed in the stored cleaning liquid. Thus, the lower surface of the development liquid nozzle can be cleaned.

(11) According to another aspect of the present invention, a development processing device includes a substrate holder that holds a substrate in a substantially horizontal attitude, a development liquid nozzle having a lower surface provided with a development liquid discharge port for discharging a development liquid, a cleaning processor, provided at a waiting position excluding a position over the substrate held by the substrate holder, that performs cleaning processing for the development liquid nozzle and a moving device that moves the development liquid nozzle relative to the substrate held by the substrate holder, and moves the development liquid nozzle to the waiting position after the development liquid is discharged by the development liquid nozzle on the substrate held by the substrate holder, wherein the cleaning processor includes a container configured to be capable of containing at least the lower surface of the development liquid nozzle, a cleaning liquid supplier that supplies a cleaning liquid to the lower surface of the development liquid nozzle contained in the container and a drain for draining the cleaning liquid supplied by the cleaning liquid supplier from the container, and an inner surface of the container is formed such that the cleaning liquid is not held between the lower surface of the development liquid nozzle and the inner surface of the container while the development liquid nozzle is contained in the container, after the cleaning liquid is drained by the drain.

In the development processing device, the development liquid nozzle is moved relative to the substrate, held in a substantially horizontal attitude by the substrate holder, by the moving device. The development liquid is discharged on the substrate from the development liquid discharge port of the development liquid nozzle such that the development processing for the substrate is performed. After the development liquid is discharged, the development liquid nozzle is moved, to the waiting position excluding the position over the substrate held by the substrate holder, by the moving device.

In the cleaning processor provided at the waiting position, at least the lower surface of the development liquid nozzle is contained in the container. The cleaning liquid is supplied to the lower surface of the development liquid nozzle contained in the container by the cleaning liquid supplier. Thus, the contaminants adhering to the lower surface of the development liquid nozzle are removed. The supplied cleaning liquid is drained from the container by the drain.

After the cleaning liquid is drained, the cleaning liquid is not held between the lower surface of the development liquid nozzle and the inner surface of the container while the development liquid nozzle is contained in the container. Thus, when the development liquid nozzle is retracted from the container, a large droplet of the cleaning liquid is prevented from adhering to the lower surface of the development liquid nozzle. Therefore, when the development liquid nozzle is moved over the substrate, the cleaning liquid is prevented from dropping on the substrate from the development liquid nozzle after the cleaning processing. Further, foreign matters included in the cleaning liquid are prevented from being fixed on the development liquid nozzle. Thus, development defects of the substrate are prevented.

(12) The lower surface of the development liquid nozzle may be provided to extend in one direction, the development liquid discharge port may be provided at the lower surface to extend in the one direction, the container may include a groove extending in the one direction and a cleaning liquid discharge port for discharging the cleaning liquid may be provided at an inner surface of the groove as the cleaning liquid supplier.

In this case, the cleaning liquid is discharged on the development liquid nozzle from a cleaning liquid supply port provided at the inner surface of the groove while the development liquid nozzle is contained in the groove extending in the one direction. The inner surface of the groove is formed such that the cleaning liquid is not held between the lower surface of the development liquid nozzle and the inner surface of the groove. Thus, when the development liquid nozzle is moved over the substrate, the cleaning liquid is prevented from dropping on the substrate from the lower surface of the development liquid nozzle extending in the one direction, and the foreign matters are prevented from being fixed on the development liquid nozzle. As a result, the development defects of the substrate are prevented.

(13) The drain may include a drain port provided at a bottom of the groove. In this case, the cleaning liquid is drained from the bottom of the groove, so that it becomes more difficult for the cleaning liquid to remain in the groove. Thus, the cleaning liquid is more reliably prevented from being held between the lower surface of the development liquid nozzle and the inner surface of the groove.

(14) The groove may have an inclined surface inclined obliquely upward outward from the drain port. In this case, the cleaning liquid remaining in the groove and the cleaning liquid dropped in the groove from the development liquid nozzle are led to the drain port via the inclined surface thereby being drained from the drain port. This makes it more difficult for the cleaning liquid to remain in the groove. Therefore, the cleaning liquid is more reliably prevented from being held between the lower surface of the development liquid nozzle and the inner surface of the groove.

(15) A difference in height between a lower end of the lower surface of the development liquid nozzle and a bottom of the groove while the development liquid nozzle is contained in the groove may be set to not less than 5 mm.

In this case, the cleaning liquid is more reliably prevented from being held between the lower surface of the development liquid nozzle and the inner surface of the groove.

(16) The groove may be configured to be capable of storing the cleaning liquid supplied from the cleaning liquid discharge port.

In this case, at least part of the development liquid nozzle is kept dipped in the stored cleaning liquid. Thus, the contaminants adhering to the development liquid nozzle are efficiently removed.

(17) An outflow portion from which the cleaning liquid stored in the groove can flow out may be provided at least one end of the groove.

In this case, the stored cleaning liquid flows in the groove. Thus, the contaminants adhering to the development liquid nozzle can be more effectively removed.

(18) A first gas discharge port for discharging gas may be provided at a position in an inner surface of the groove lower than a liquid surface of the cleaning liquid stored in the groove.

In this case, the gas is discharged from the first gas discharge port such that the gas bubbles are mixed in the cleaning liquid stored in the groove. When the gas bubbles in the cleaning liquid collide with the development liquid nozzle, the contaminants adhering to the development liquid nozzle are removed by its colliding forces. Further, the contaminants adhering to the development liquid nozzle are broken up by the pressure wave generated by the movement, collision and the like of the gas bubbles. Further, the gas bubbles adhere to the contaminants and strip the contaminants off the development liquid nozzle. Thus, the development liquid nozzle can be cleaned.

(19) A second gas discharge port for discharging gas so as to cover an upper opening of the groove may be provided at an inner surface of the groove.

In this case, the gas is discharged from the second gas discharge port such that the cleaning liquid is prevented from splashing to the outside of the groove. Therefore, the cleaning liquid is prevented from adhering to the substrate.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 5A is a plan view of the waiting pod, FIG. 5B is a cross sectional view taken along the line A1-A1 of the waiting pod;

FIG. 12 is a side view showing one end portion of the waiting pod;

DESCRIPTION OF THE PREFERRED EMBODIMENTS

A development processing device according to embodiments of the present invention will be described with reference to the drawings.

(1) First Embodiment

(1-1) Configuration of the Development Processing Device

Figure 1:
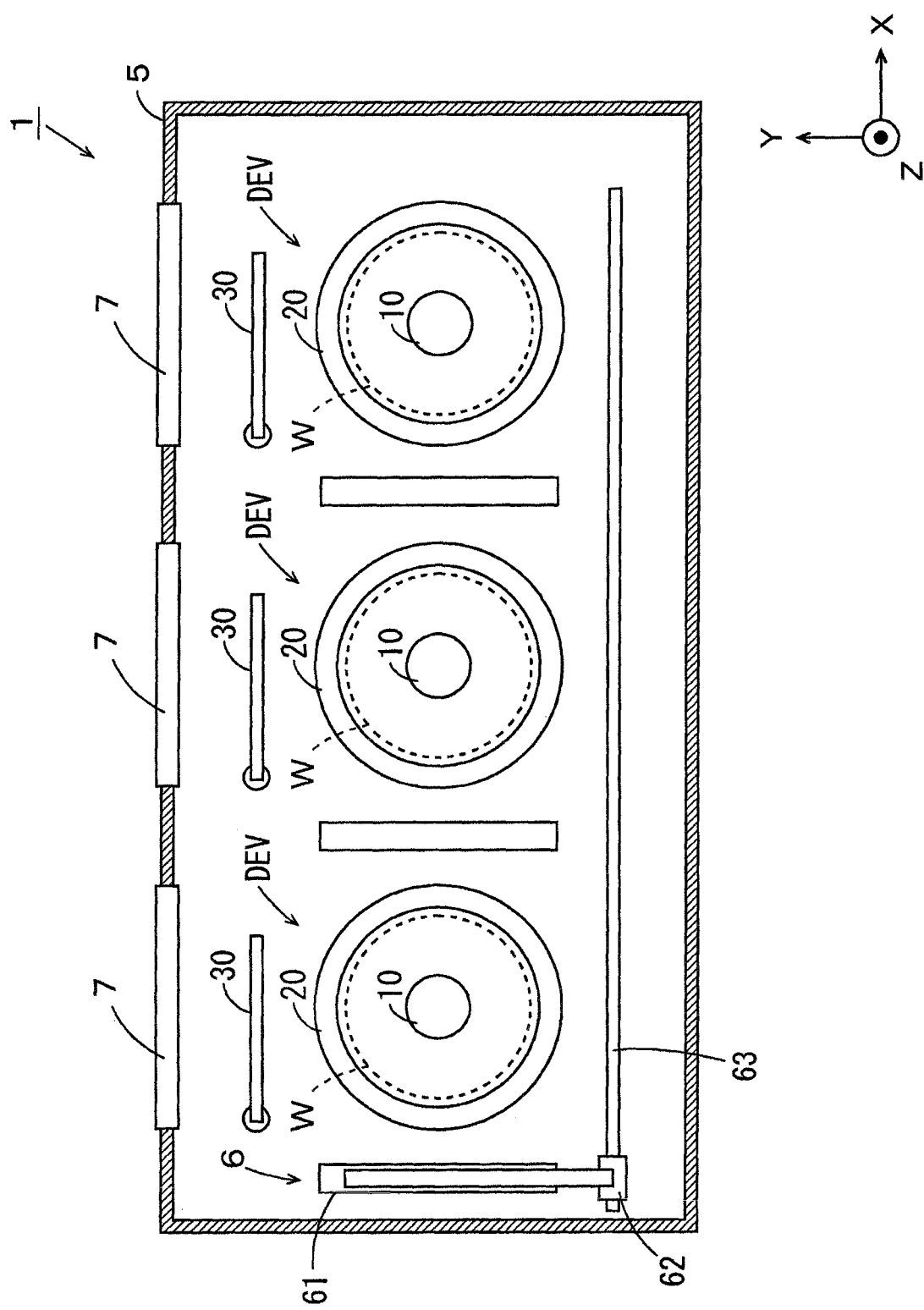
FIG. 1 is a schematic plan view of a development processing device according to an embodiment.
Figure 2:
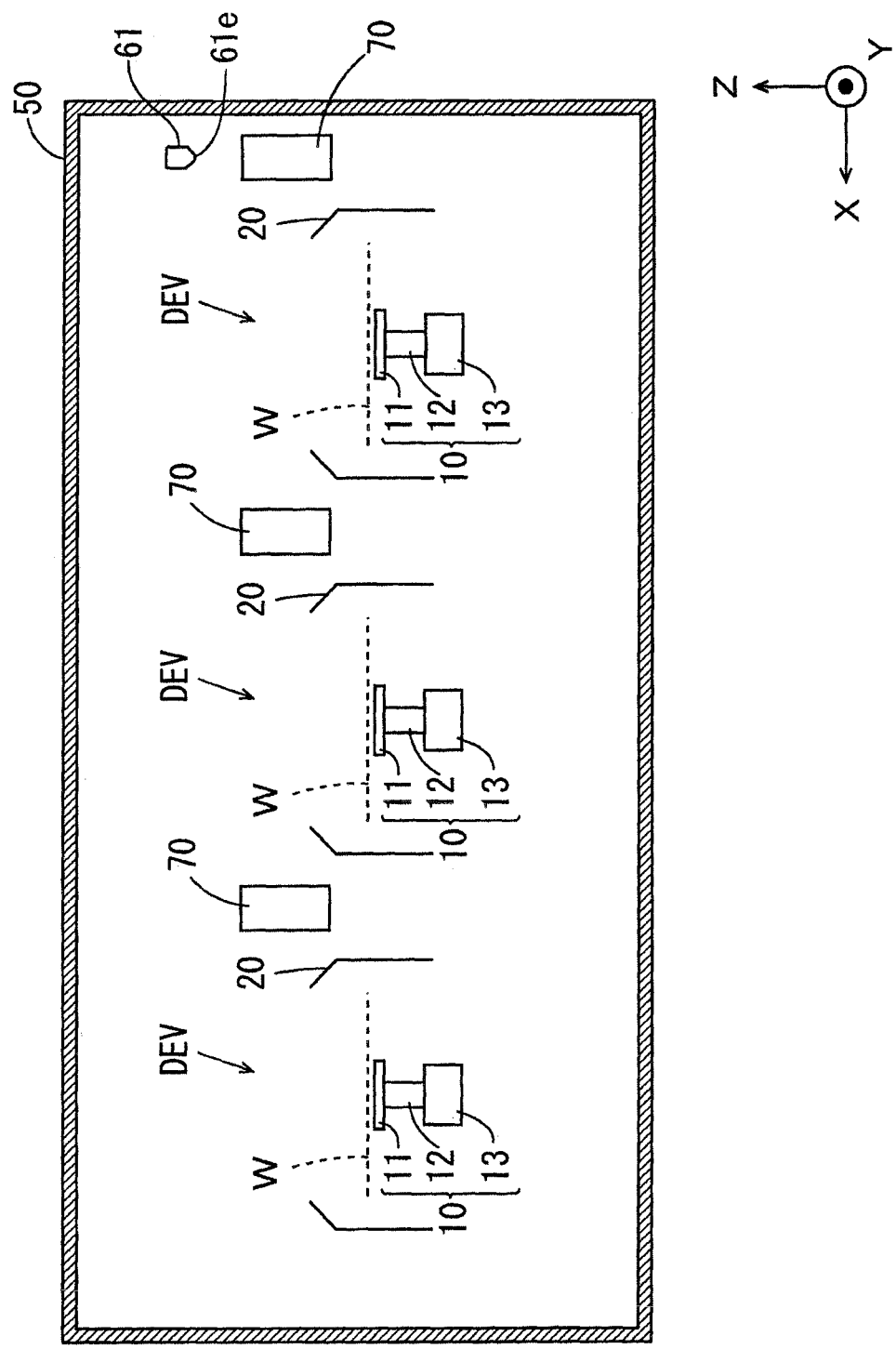
FIG. 2 is a schematic side view of the development processing device of FIG. 1.

FIG. 1 is a schematic plan view of the development processing device according to the present invention. FIG. 2 is a schematic side view of the development processing device of FIG. 1. FIGS. 1, 2 and subsequent given drawings described below are accompanied by the arrows that indicate X, Y, and Z directions orthogonal to one another for clarity of a positional relationship. The X and Y directions are orthogonal to each other within a horizontal plane and the Z direction corresponds to a vertical direction.

As shown in FIG. 1, the development processing device 1 includes a casing 5. Three development processing units DEV and a development liquid supplier 6 are provided in the casing 5. The three development processing units DEV have the same configuration and are arranged in the X direction. Each development processing unit DEV includes a rotating holder 10, a processing cup 20 and a rinse nozzle 30.

As shown in FIG. 2, each rotating holder 10 includes a spin chuck 11, a rotating shaft 12 and a motor 13. The spin chuck 11 is provided at the upper end of the rotating shaft 12 connected to the motor 13. The spin chuck 11 holds a substrate W in a horizontal attitude by absorbing substantially the center of the lower surface of the substrate W under vacuum. The rotating shaft 12 and the spin chuck 11 are integrally rotated by the motor 13, causing the substrate W held by the spin chuck 11 to rotate around an axis extending in the vertical direction (Z direction).

Each processing cup 20 is provided to surround the rotating holder 10. The processing cup 20 is lifted/lowered between a lower position and an upper position by a cup lifting/lowering mechanism (not shown). When the processing cup 20 is at the lower position, the upper end of the processing cup 20 is lower than a holding position of the substrate W by the spin chuck 11. At the time of carrying in/out the substrate W to/from each development processing unit DEV, the processing cup 20 of the development processing unit DEV is arranged at the lower position. When the processing cup 20 is at the upper position, the upper end of the processing cup 20 is higher than the holding position of the substrate W by the spin chuck 11 and the substrate W is surrounded by the processing cup 20. At the time of the development processing for the substrate W, the processing cup 20 is arranged at the upper position and droplets splashing from the rotating substrate W are received by the processing cup 20. The received droplets are led to a drain (not shown).

Each rinse nozzle 30 is provided to be swingable between a waiting position outside of the processing cup 20 and the rinse position over the center of the substrate W held by the spin chuck 11. The rinse nozzle 30 supplies a rinse liquid on the substrate W held by the spin chuck 11 at the rinse position.

As shown in FIG. 1, the development liquid supplier 6 includes a slit nozzle 61, a nozzle lifting/lowering mechanism 62 and a nozzle sliding mechanism 63. The slit nozzle 61 has a slit-shaped outlet port 61e (FIG. 2) extending in the Y direction. The length of the outlet port 61e is at least larger than a diameter of the substrate W. The slit nozzle 61 is lifted/lowered in the Z direction by the nozzle lifting/lowering mechanism 62. Further, the slit nozzle 61 is moved in a direction of a row of the three development processing units DEV (X direction) by the nozzle sliding mechanism 63 so as to pass over each substrate W held by each spin chuck 11.

A development liquid is supplied to the slit nozzle 61 from a development liquid supply source (not shown). The slit nozzle 61 discharges the development liquid in a strip-shape on the substrate W from the outlet port 61e (FIG. 2) while being moved over the substrate W held by the spin chuck 11. This causes a liquid layer of the development liquid to be formed to cover the upper surface of the substrate W. The substrate W is held still at the time of formation of the liquid layer of the development liquid.

Waiting positions for the slit nozzle 61 are provided between the adjacent development processing units DEV and outside of the development processing unit DEV positioned at one end, and a waiting pod 70 is provided at each waiting position. The slit nozzle 61 is moved to one of the waiting positions in a period during which the development liquid is not discharged on the substrate W and waits at a position over one of the waiting pods 70. In the waiting pod 70, the slit nozzle 61 regularly performs automatic dispensing processing for discharging and draining the development liquid that remains inside. This prevents the modified development liquid or the deteriorated development liquid over time from being supplied to the substrate W. Further, cleaning processing for the slit nozzle 61 is performed in the waiting pod 70. Details of the waiting pod 70 will be described below.

Three shutters 7 are provided in one sidewall of the casing 50 to be opposite to the three development processing units DEV, respectively. At the time of carrying in/out the substrate W to/from each development processing unit DEV, the corresponding shutter 7 is opened. At the time of the development processing in each development processing unit DEV, the corresponding shutter 7 is closed.

(1-2) Operation of the Development Processing Device

Figure 3:
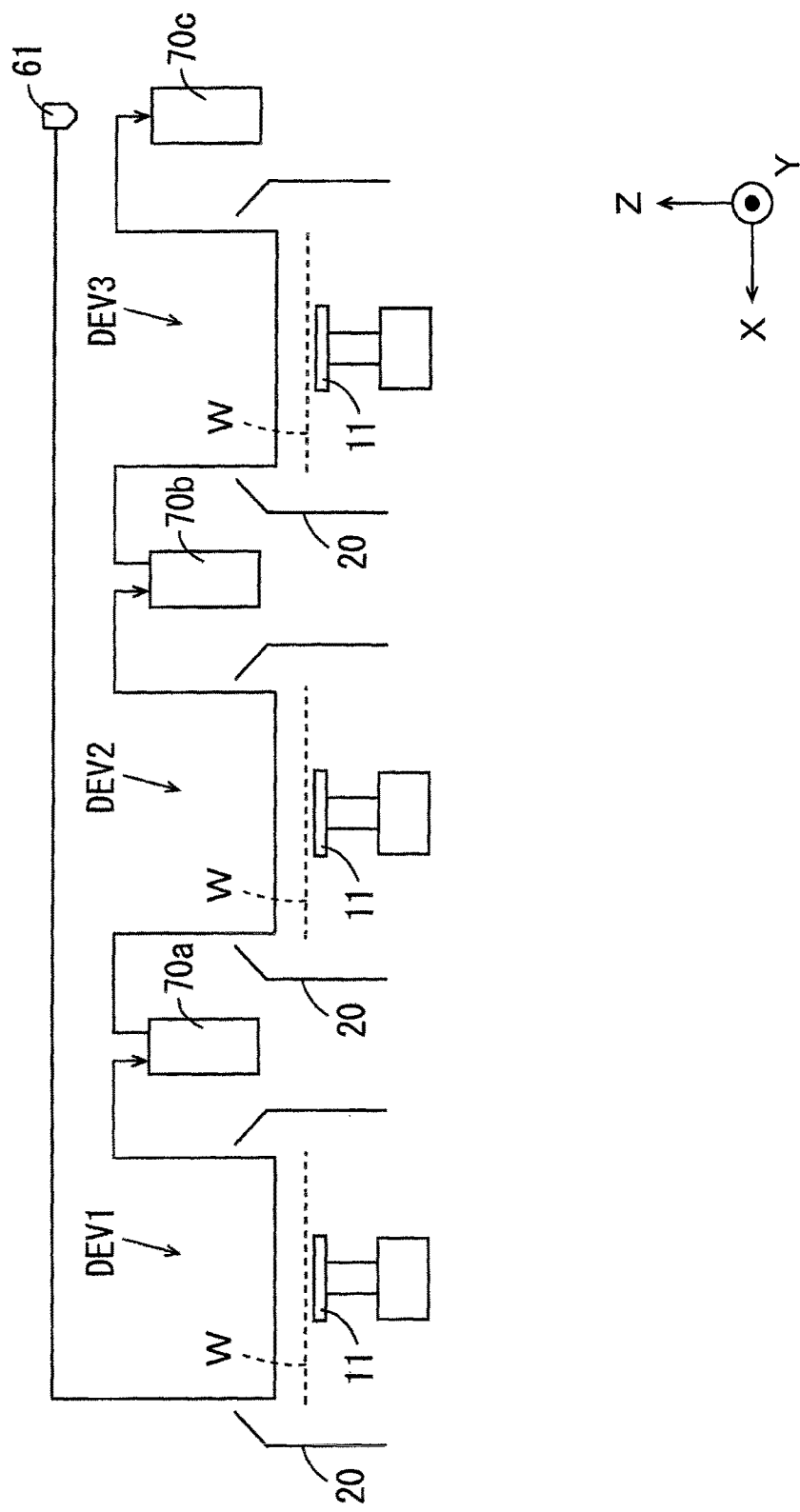
FIG. 3 is a diagram showing a moving path of a slit nozzle.

Summary of the operation of the development processing device 1 will be described. The operation of each constituent element of the development processing device 1 is controlled by a controller 80 (FIG. 4) described below. FIG. 3 is a diagram showing a moving path of the slit nozzle 61. In FIG. 3, the three development processing units DEV are referred to as development processing units DEV1, DEV2, DEV3, respectively, and the three waiting pods 70 are referred to as waiting pods 70a, 70b, 70c, respectively. The development processing units DEV1, DEV2, DEV3 are arranged in this order in the X direction. The waiting pod 70a is arranged between the development processing units DEV1, DEV2, the waiting pod 70b is arranged between the development processing units DEV2, DEV3 and the waiting pod 70c is arranged outside of the development processing unit DEV3.

When the slit nozzle 61 is positioned over the waiting pod 70c, the substrate W after exposure processing is transported onto the spin chuck 11 of the development processing unit DEV1 by a transport device (not shown). In this case, the substrate W is transported onto the spin chuck 11 of the development processing unit DEV1 while the processing cup 20 of the development processing unit DEV1 is at the lower position, and the processing cup 20 is lifted to the upper position after the substrate W is transported. Subsequently, the slit nozzle 61 is moved to a position over one end of the substrate W held by the spin chuck 11 of the development processing unit DEV1 (end of the side away from the waiting pod 70a in the X direction), and is moved to a position over the other end of the substrate W (end of the side close to the waiting pod 70a in the X direction) while discharging the development liquid. Thereafter, the slit nozzle 61 is moved to a position over the waiting pod 70a.

When the slit nozzle 61 is positioned over the waiting pod 70a, the substrate W after the exposure processing is transported onto the spin chuck 11 of the development processing unit DEV2 by the transport device (not shown). In this case, the substrate W is transported onto the spin chuck 11 of the development processing unit DEV2 while the processing cup 20 of the development processing unit DEV2 is at the lower position, and the processing cup 20 is lifted to the upper position after the substrate W is transported. Subsequently, the slit nozzle 61 is moved to a position over one end of the substrate W (end of the side close to the waiting pod 70a in the X direction) held by the spin chuck 11 of the development processing unit DEV2 and is moved to a position over the other end of the substrate W (end of the side close to the waiting pod 70b in the X direction) while discharging the development liquid. Thereafter, the slit nozzle 61 is moved to a position over the waiting pod 70b.

When the slit nozzle 61 is positioned over the waiting pod 70b, the substrate W after the exposure processing is transported onto the spin chuck 11 of the development processing unit DEV3 by the transport device (not shown). In this case, the substrate W is transported onto the spin chuck 11 of the development processing unit DEV3 while the processing cup 20 of the development processing unit DEV3 is at the lower position, and the processing cup 20 is lifted to the upper position after the substrate W is transported. Subsequently, the slit nozzle 61 is moved to a position over one end of the substrate W (end of the side close to the waiting pod 70b in the X direction) held by the spin chuck 11 of the development processing unit DEV3, and is moved to a position over the other end of the substrate W (end of the side close to the waiting pod 70c in the X direction) while discharging the development liquid. Thereafter, the slit nozzle 61 is moved to a position over the waiting pod 70c.

In each of the development processing units DEV1 to DEV3, the slit nozzle 61 discharges the development liquid while moving over the substrate W, whereby the liquid layer of the development liquid is formed on the substrate W. In this state, development reaction of a photosensitive film (a resist film) formed on the substrate W progresses. When a predetermined time period is elapsed since the liquid layer of the development liquid is formed, the rinse nozzle 30 is moved to the rinse position and discharges the rinse liquid. This causes the development reaction of the photosensitive film to stop. Next, the rotating holder 10 rotates the substrate W while the rinse liquid is being discharged on the substrate W, whereby the development liquid on the substrate W is cleaned away. Thereafter, the substrate W is rotated while the discharge of the rinse liquid is stopped, whereby the rinse liquid is shaken off from the substrate W, so that the substrate W is dried. The dried substrate W is transported from the spin chuck 11 by the transport device (not shown). When the substrate W is transported from the spin chuck 11, the processing cup 20 is lowered to the lower position. A series of such operations are repeated in the development processing device 1.

Timing for carrying in/out the substrate W to/from each of the development processing units DEV1 to DEV3 is not limited to the examples described above, and may be arbitrarily changed depending on operation speed, development processing time, operation speed of the transport device or the like of the development processing device 1.

(1-3) Configuration of the Waiting Pod

Figure 4:
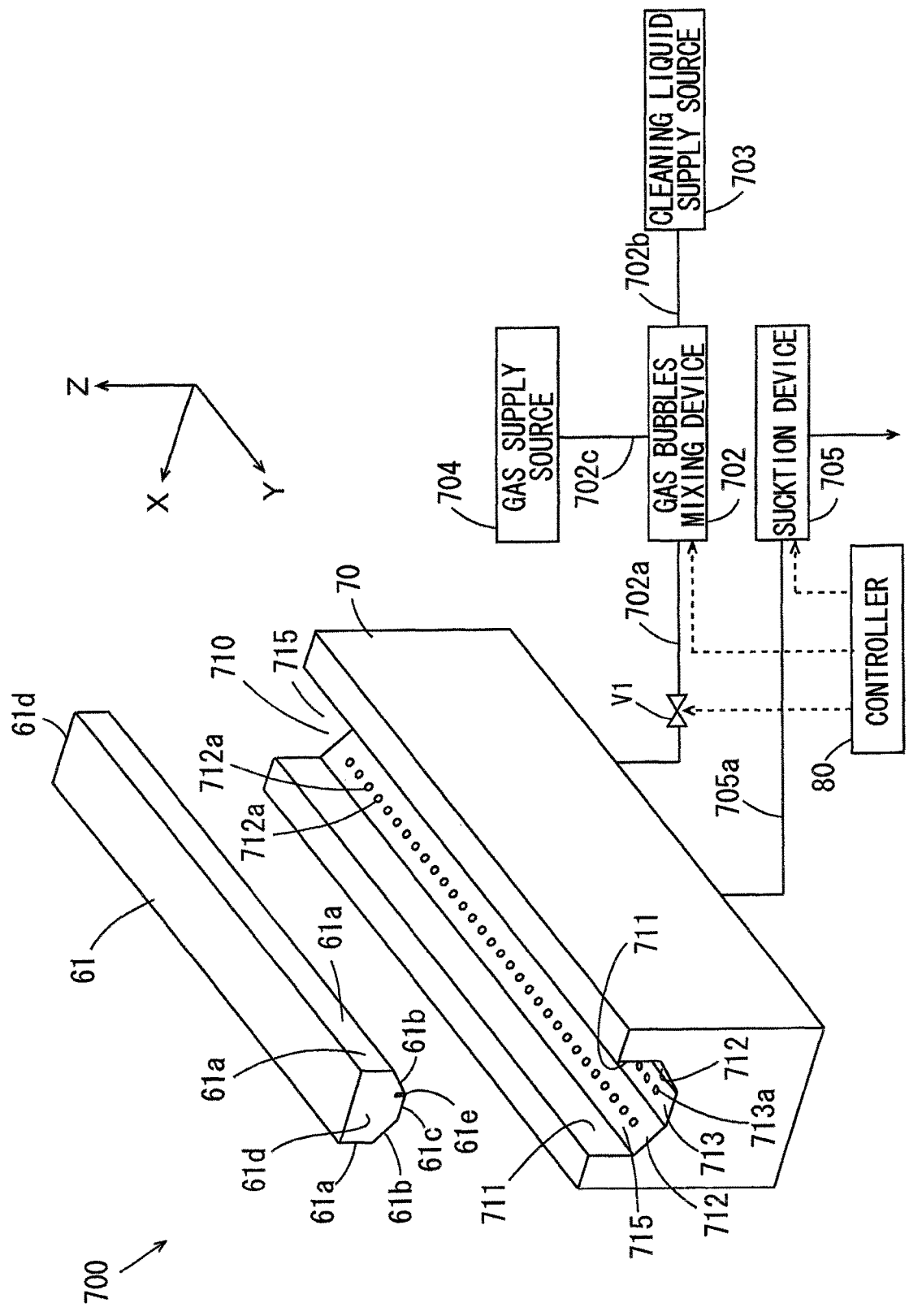
FIG. 4 is an external perspective view of a waiting pod and the slit nozzle.
Figure 6:
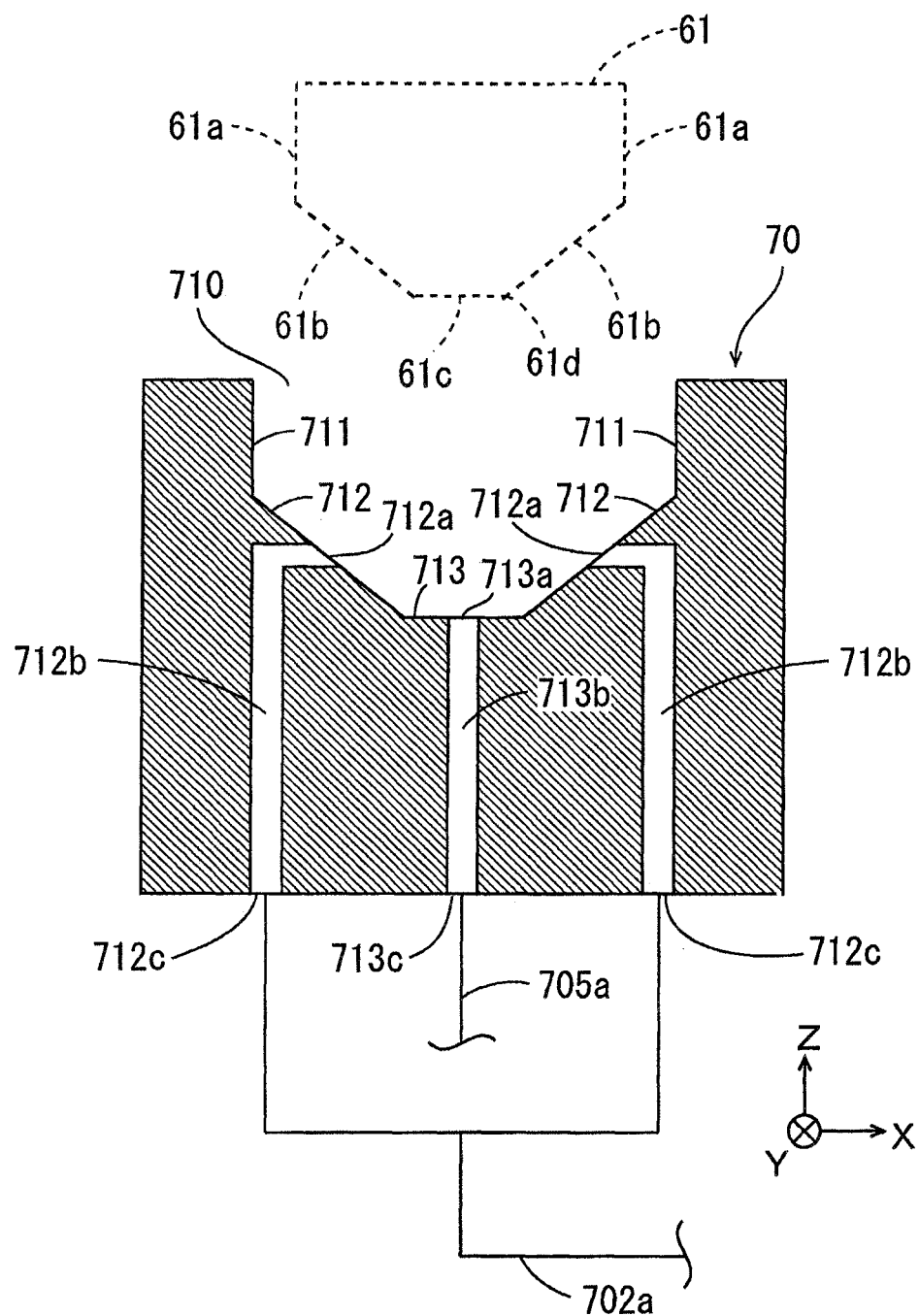
FIG. 6 is a cross sectional view taken along the line B1-B1 of the waiting pod.

Description will be made of the details of the waiting pod 70. FIG. 4 is an external perspective view of the waiting pod 70 and the slit nozzle 61. FIG. 5A is a plan view of the waiting pod 70, and FIG. 5B is a cross sectional view taken along the line A1-A1 of FIG. 5A. FIG. 6 is a cross sectional view taken along the line B1-B1 of FIG. 5A.

As shown in FIG. 4, the slit nozzle 61 has a pair of side surfaces 61a, a pair of inclined surfaces 61b and a bottom surface 61c extending in the Y direction, respectively and a pair of end surfaces 61d extending substantially vertically in the Y direction. The pair of side surfaces 61a extends in the vertical direction (Z direction), and the pair of inclined surfaces 61b extends obliquely downward so as to come close towards each other from the lower ends of the pair of side surfaces 61a. The bottom surface 61c extends horizontally so as to couple the lower ends of the inclined surfaces 61b. An outlet port 61e is provided at a coupling portion between the bottom surface 61c and the one inclined surface 61b.

The waiting pod 70 has a boxy shape, and the length of the waiting pod 70 in the Y direction is longer than that of the slit nozzle 61 in the Y direction. A groove 710 having a substantially V-shaped cross section is provided at an upper portion of the waiting pod 70 so as to extend in the Y direction. The groove 710 has a pair of side surfaces 711, a pair of inclined surfaces 712 and a bottom surface 713. The pair of side surfaces 711 extends downward vertically from the upper surface of the waiting pod 70. The pair of inclined surfaces 712 extends so as to come close to each other from the lower ends of the pair of side surfaces 711, respectively. The bottom surface 713 extends horizontally so as to couple the lower ends of the pair of inclined surfaces 712 with each other. The both ends of the groove 710 are open outward. The both ends of the groove 710 constitute an outflow portion 715 for draining the cleaning liquid supplied to the slit nozzle 61 to the outside of the waiting pod 70, respectively.

The pair of side surfaces 711 of the groove 710 is respectively in parallel with the pair of side surfaces 61a of the slit nozzle 61, the pair of the inclined surfaces 712 of the groove 710 is respectively in parallel with the pair of the inclined surfaces 61b of the slit nozzle 61 and the bottom surface 713 of the groove 710 is respectively in parallel with the bottom surface 61c of the slit nozzle 61.

The waiting pod 70 is connected to a gas bubbles mixing device 702 through a supply pipe 702a. An aspirator or a microbubbles generator, for example, is used as the gas bubbles mixing device 702. A valve V1 is inserted into the supply pipe 702a. The gas bubbles mixing device 702 is connected to a cleaning liquid supply source 703 through a supply pipe 702b and to a gas supply source 704 through a supply pipe 702c.

A cleaning liquid is supplied to the gas bubbles mixing device 702 from the cleaning liquid supply source 703 through the supply pipe 702b. Pure water or a solution including surface-active agent, for example, is used as the cleaning liquid. Gas is supplied to the gas bubbles mixing device 702 from the gas supply source 704 through the supply pipe 702c. Nitrogen gas, for example, is used as the gas. In the gas bubbles mixing device 702, the supplied gas is mixed in the cleaning liquid as fine gas bubbles. The valve V1 is opened such that the cleaning liquid with the gas bubbles mixed therein (hereinafter referred to as a cleaning liquid containing gas bubbles) is supplied to the waiting pod 70 through the supply pipe 702a.

The size of the gas bubbles mixed in the cleaning liquid can be adjusted by changing the type or replacing parts of the gas bubbles mixing device 702 or the like. Further, the volume ratio of the gas in the cleaning liquid containing gas bubbles is preferably smaller than that of the cleaning liquid in order to obtain enhanced cleaning effect.

Further, the waiting pod 70 is connected to a suction device 705 through a drain pipe 705a. An aspirator is used as the suction device 705, for example. The cleaning liquid containing gas bubbles and the removed contaminants are led to a drain (not shown) from the waiting pod 70 by the suction device 705.

Opening/closing of the valve V1, and the operations of the gas bubbles mixing device 702 and the suction device 705 are controlled by a controller 80. As described above, the controller 80 controls the operation of other constituent elements of the development processing device 1.

In the present embodiment, a cleaning processor 700 is constituted by the waiting pod 70, the gas bubbles mixing device 702 and the suction device 705. The common gas bubbles mixing device 702 and the suction device 705 may be used for the three waiting pods 70 of FIG. 1, or a plurality of gas bubbles mixing devices 702 and suction devices 705 may be used.

As shown in FIGS. 5A and 5B, a plurality of openings 712a are provided at each inclined surface 712 to be arranged at equal intervals in the Y direction. A plurality of openings 713a are provided at the bottom surface 713 to be arranged at equal intervals in the Y direction.

As shown in FIG. 6, a pair of connection ports 712c and a connection port 713c are provided at the bottom surface of the waiting pod 70. A pair of cleaning liquid supply paths 712b is provided to respectively extend between the one connection port 712c and the plurality of openings 712a of the one inclined surface 712, and between the other connection port 712c and the plurality of openings 712a of the other inclined surface 712. Each cleaning liquid supply path 712b extends upward from each connection port 712c and is branched into a plurality of paths to extend inward horizontally thereby being connected to the plurality of openings 712a. Further, a drain path 713b is provided to extend between the connection port 713c and the plurality of openings 713a. The drain path 713b extends upward from the connection port 713c and is further branched into a plurality of paths to be connected to the plurality of openings 713a.

The supply pipe 702a extending from the gas bubbles mixing device 702 of FIG. 4 is connected to the pair of connection ports 712c. The cleaning liquid containing gas bubbles is introduced into each cleaning liquid supply path 712b of the waiting pod 70 from the gas bubbles mixing device 702 through the supply pipe 702a. The introduced cleaning liquid is discharged from the plurality of openings 712a of the inclined surface 712.

The drain pipe 705a extending from the suction device 705 of FIG. 4 is connected to the connection port 713c. The cleaning liquid containing gas bubbles and the removed contaminants are sucked in by the suction device 705 through the drain path 713b and the drain pipe 705a. The sucked-in cleaning liquid containing gas bubbles and the contaminants are led by the drain (not shown) to be drained.

(1-4) Cleaning Processing

As described above, the slit nozzle 61 discharges the development liquid on the substrate W in each development processing unit DEV (FIG. 1) and then is moved to a position over the waiting pod 70 adjacent to the development processing unit DEV. In the waiting pod 70, cleaning processing for the slit nozzle 61 is performed.

Figure 7:
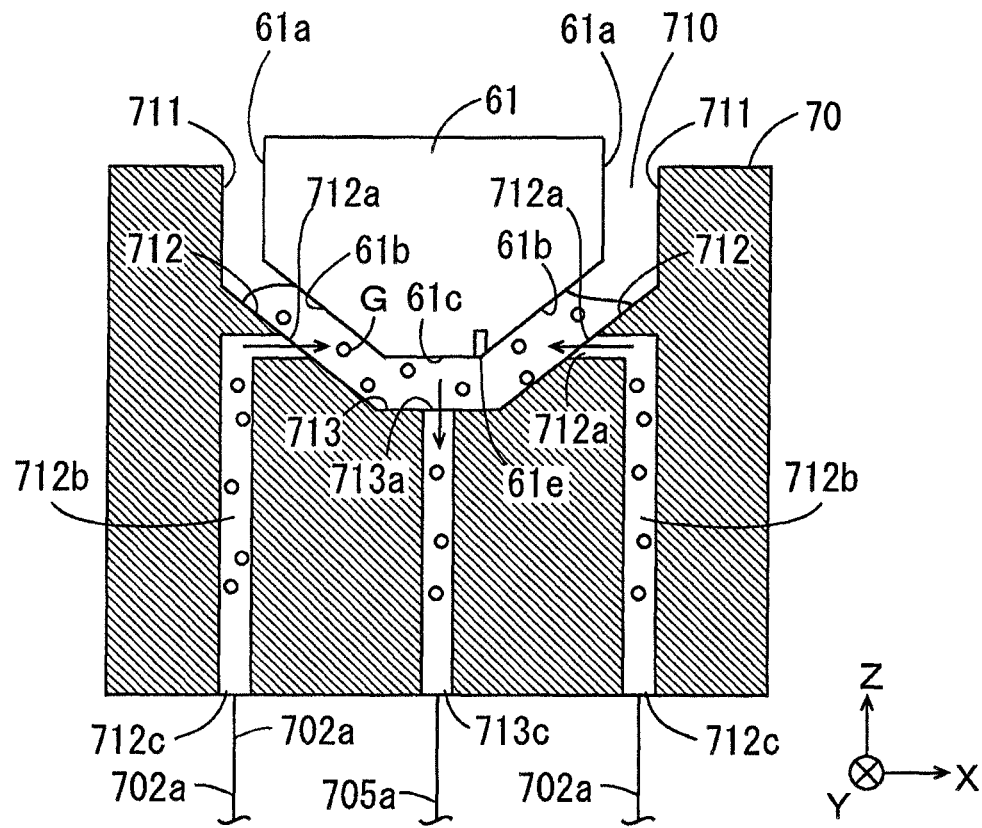
FIG. 7 is a schematic cross sectional view for explaining cleaning processing for the slit nozzle in the waiting pod.
Figure 8:
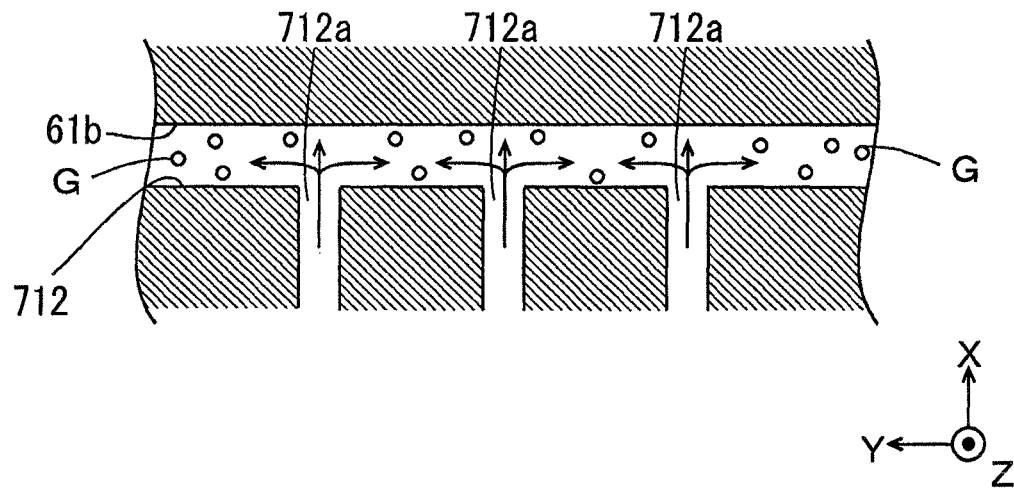
FIG. 8 is a schematic cross sectional view for explaining the cleaning processing of the slit nozzle in the waiting pod.

FIGS. 7 and 8 are cross sectional views for explaining the cleaning processing for the slit nozzle 61 in each waiting pod 70. As shown in FIGS. 7 and 8, a lower portion of the slit nozzle 61 including at least the inclined surfaces 61b and the lower surface 61c is contained in the groove 710 of the waiting pod 70 at the time of the cleaning processing. In this case, the pair of side surfaces 711 of the groove 710 is respectively opposite to the pair of side surfaces 61a of the slit nozzle 61, the pair of inclined surfaces 712 of the groove 710 is respectively opposite to the pair of inclined surfaces 61b of the slit nozzle 61 and the bottom surface 713 of the groove 710 is respectively opposite to the bottom surface 61c of the slit nozzle 61.

In this state, the cleaning liquid containing gas bubbles is discharged from the plurality of openings 712a of the inclined surface 712 towards the slit nozzle 61. In this case, as shown in FIG. 8, bubbles G in the cleaning liquid containing gas bubbles collide with the inclined surfaces 61b of the slit nozzle 61 while moving through a gap between the inclined surfaces 712 of the groove 710 and the inclined surfaces 61b of the slit nozzle 61. Further, the bubbles G in the cleaning liquid containing gas bubbles collide with the bottom surface 61c of the slit nozzle 61 while moving through a gap between the bottom surface 713 of the groove 710 and the bottom surface 61c of the slit nozzle 61.

Thus, contaminants adhering to the inclined surfaces 61b and the bottom surface 61c of the slit nozzle 61 are removed by colliding forces of the bubbles G. Here, the contaminants include the development liquid and foreign matters such as resist residues. Further, the contaminants adhering to the inclined surface 61b and the bottom surface 61c of the slit nozzle 61 are broken up by the pressure wave generated due to the movement, collision and the like of the bubbles G. Further, the bubbles G adhere to the contaminants and strip the contaminants off the inclined surfaces 61b and the bottom surface 61c of the slit nozzle 61.

Further, the plurality of bubbles G move dispersively into different directions in the gap between the inclined surfaces 712 of the groove 710 and the inclined surfaces 61b of the slit nozzle 61 and between the bottom surface 713 of the groove 710 and the lower surface 61c of the slit nozzle 61 by repeating to collide, burst and unite. Thus, the inclined surfaces 61b and the lower surface 61c of the slit nozzle 61 can be uniformly cleaned.

Further, the cleaning liquid containing gas bubbles is more difficult to splash than the cleaning liquid without gas bubbles. Therefore, the cleaning liquid containing gas bubbles is prevented from splashing to the outside of the waiting pod 70 and adhering to the substrate W on the spin chuck 11 or the substrate W that is being transported.

The suction device 705 (FIG. 4) operates at the time of the discharge of the cleaning liquid containing gas bubbles. Thus, parts of the cleaning liquid containing gas bubbles and the removed contaminants are sucked in from the plurality of openings 713a of the bottom surface 713 to be drained.

Therefore, an adherence of the removed contaminants to the inclined surfaces 61*b* and the bottom surface 61*c* of the slit nozzle 61 is suppressed.

Further, the cleaning liquid containing gas bubbles supplied to the slit nozzle 61 flows out to the outside of the waiting pod 70 from the outflow portion 715 of the groove 710 (FIG. 4) together with the removed contaminants. Thus, the cleaning liquid containing gas bubbles smoothly flows in the longitudinal direction (Y direction) of the slit nozzle 61 in the groove 710. Therefore, the entire inclined surfaces 61*b* and lower surface 61*c* of the slit nozzle 61 can be more effectively cleaned. The cleaning liquid containing gas bubbles and the contaminants that have flowed out are led to the drain (not shown).

After a certain time period is elapsed since the discharge of the cleaning liquid containing gas bubbles is started, the discharge of the cleaning liquid containing gas bubbles from the openings 712*a* is stopped and the operation of the suction device 705 is stopped. Thus, the cleaning processing for the slit nozzle 61 is completed.

(1-5) Effect

In the development processing device 1 according to the present embodiment, the cleaning processing for the slit nozzle 61 is performed using the cleaning liquid with the gas bubbles mixed therein in the waiting pod 70 after the development liquid is discharged on the substrate W from the slit nozzle 61. Thus, the slit nozzle 61 can be cleaned. As a result, the development defects of the substrate W caused by contamination of the slit nozzle 61 can be prevented.

Further, in the present embodiment, the cleaning liquid with the gas bubbles mixed in advance therein by the gas bubbles mixing device 702 is discharged from the openings 712*a* towards the slit nozzle 61. Thus, the gas bubbles can efficiently collide with the slit nozzle 61. Therefore, the slit nozzle 61 can be efficiently cleaned.

(1-6) Modification Examples of the Waiting Pod (1-6-1)

Position, quantity, size, shape and so on of the openings 712*a*, 713*a* are not limited to the example described above and may suitably be changed. For example, the plurality of openings 712*a* may be provided in multiple stages and the plurality of openings 713*a* may be provided to form a plurality of rows. Further, the openings 712*a*, 713*a* may be slit-shaped, respectively.

(1-6-2)

While the openings 712*a* for discharging the cleaning liquid are provided at the inclined surfaces 712 in the first embodiment, openings for discharging the cleaning liquid may be provided at the bottom surface 713 instead of the openings 712*a* or in addition to the openings 712*a*. Further, while the openings 713*a* for draining the cleaning liquid is provided at the bottom surface 713 in the first embodiment, openings for draining the cleaning liquid may be provided at the inclined surfaces 712 instead of the openings 713*a* or in addition to the openings 713*a*.

(1-6-3)

While suction is performed by the suction device 705 at the time of the discharge of the cleaning liquid containing gas bubbles from the openings 712*a* in the first embodiment, the suction by the suction device 705 does not have to be performed if the contaminants can be prevented from adhering again or the contaminants do not need to be prevented from adhering again. In this case, the cleaning liquid containing gas bubbles and the contaminants may be drained from the plurality of openings 713*a* by its own weight or the plurality of openings 713*a* do not have to be provided.

(1-6-4)

While the outflow portion 715 is provided at both ends of the groove 710 in the first embodiment, the outflow portion 715 may be provided at only the one end. Further, when a flow of the cleaning liquid in one direction can be formed or does not need to be formed, the cleaning liquid may flow out from another location of the groove 710.

(1-6-5)

The development liquid may be discharged from the openings 712*a* before the cleaning liquid containing gas bubbles is discharged from the openings 712*a*. In this case, the resist residues adhering to the slit nozzle 61 can be dissolved to be removed. Further, other openings for discharging the development liquid may be provided separately instead of discharging the development liquid from the opening 712*a*.

(2) Second Embodiment

As for the second embodiment of the present invention, differences from the first embodiment described above will be described. In the second embodiment, the waiting pod 70 shown in the subsequent FIGS. 9 to 12 is used instead of the waiting pod 70 of FIGS. 4 to 6.

(2-1) Configuration of the Waiting Pod

Figure 9:
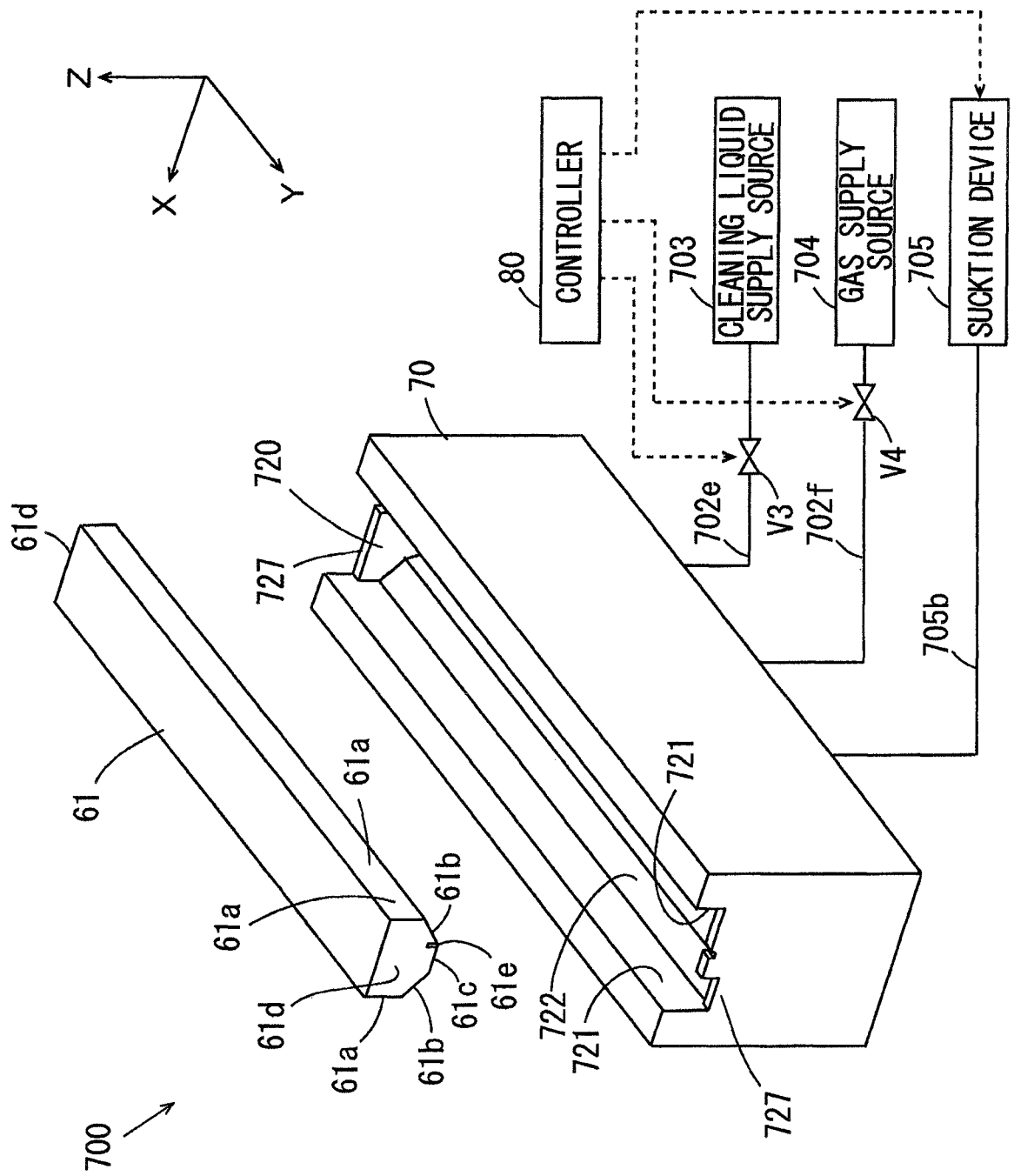
FIG. 9 is an external perspective view of the waiting pod.
Figure 10:
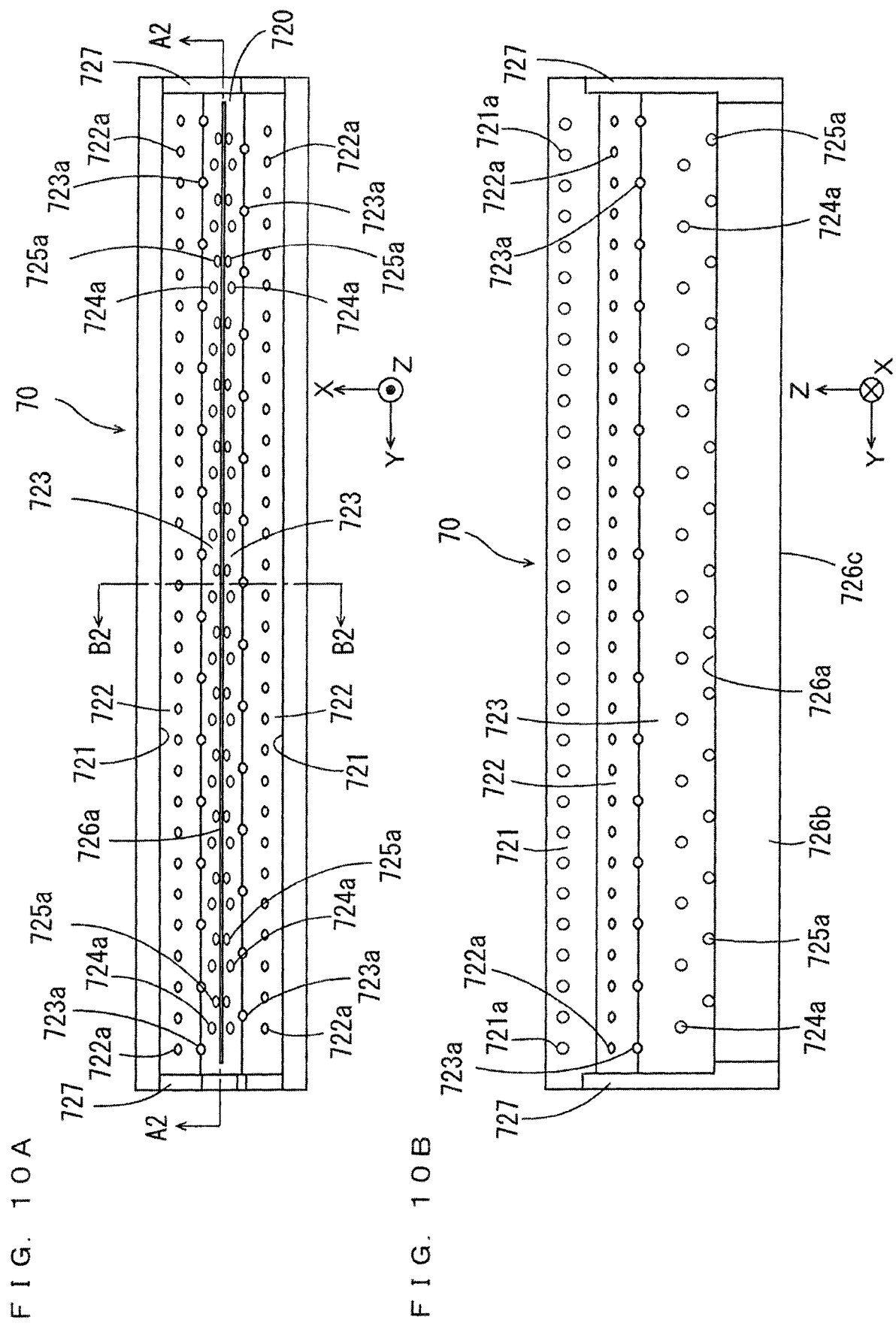
FIG. 10A is a plan view of the waiting pod.
FIG. 10B is a cross sectional view taken along the line A2-A2 of the waiting pod.
Figure 11:
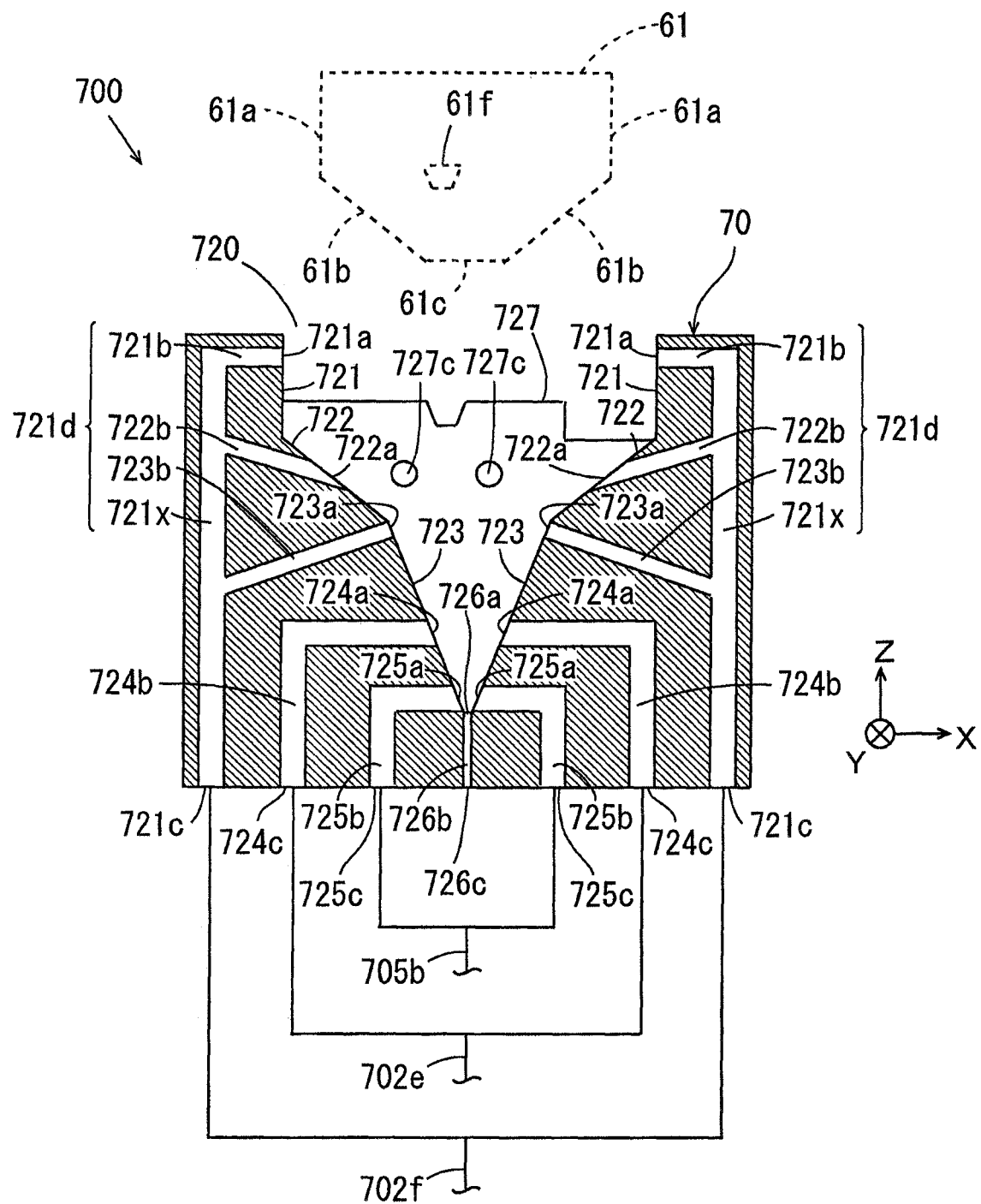
FIG. 11 is a cross sectional view taken along the line B2-B2 of the waiting pod.

FIG. 9 is an external perspective view of the waiting pod 70 according to the second embodiment. FIG. 10A is a plan view of the waiting pod 70, and FIG. 10B is a cross sectional view taken along the line A2-A2 of FIG. 10A. FIG. 11 is a cross sectional view taken along the line B2-B2 of FIG. 10A. FIG. 12 is a side view showing one end of the waiting pod 70 of FIG. 10A. As for the waiting pod 70 of FIGS. 9 to 12, differences from the waiting pod 70 of FIGS. 4 to 6 will be described.

As shown in FIG. 9, a groove 720 having a substantially V-shaped cross section is provided at an upper portion of the waiting pod 70 to extend in the Y direction. End walls 727 are provided at both ends of the groove 720.

The waiting pod 70 is connected to the cleaning liquid supply source 703 through a supply pipe 702*e*, to the gas supply source 704 through a supply pipe 702*f* and to the suction device 705 through the drain pipe 705*b*. A valve V3 is inserted into the supply pipe 702*e*, and a valve V4 is inserted into the supply pipe 702*f*.

The valve V3 is opened such that the cleaning liquid is supplied to the waiting pod 70 from the cleaning liquid supply source 703 through the supply pipe 702*e*. Pure water or a solution including surface-active agent, for example, is used as the cleaning liquid. Further, the valve V4 is opened such that the gas is supplied to the waiting pod 70 from the gas supply source 704 through the supply pipe 702*f*. Nitrogen gas, for example, is used as the gas. The cleaning liquid and the removed contaminants are led to the drain (not shown) from the waiting pod 70 by the suction device 705. Operation of opening/closing of the valves V3, V4 and the suction device 705 is controlled by the controller 80.

In the present embodiment, a cleaning processor 700 is constituted by the waiting pod 70 and the suction device 705. The common suction device 705 or the plurality of suction devices 705 may be used for the three waiting pods 70 of FIG. 1.

As shown in FIGS. 10A, 10B and 11, the groove 720 has a pair of side surfaces 721, a pair of first upper inclined surfaces 722 and a pair of lower inclined surfaces 723. The pair of side surfaces 721 extends downward vertically from the upper surface of the waiting pod 70. The pair of upper inclined surfaces 722 extends obliquely downward so as to come close to each other from the lower ends of the pair of side surfaces 711, respectively. The pair of the lower inclined surfaces 723 extends obliquely downward so as to come close to each other from the lower ends of the pair of upper inclined surfaces 722. The angle of inclination of the lower inclined surfaces 723 to a horizontal plane is larger than the angle of inclination of the upper inclined surfaces 722 to a horizontal plane.

The pair of side surfaces 721 of the groove 720 is respectively in parallel with the pair of side surfaces 61a of the slit nozzle 61, and the pair of upper inclined surfaces 722 of the groove 720 are respectively in parallel with the pair of inclined surfaces 61b of the slit nozzle 61.

A plurality of openings 721a are provided at each side surface 721 to be arranged at equal intervals in the Y direction. A plurality of openings 722a are provided at each upper inclined surface 722 to be arranged at equal intervals in the Y direction. A plurality of openings 723a are provided at a boundary portion between each upper inclined surface 722 and each lower inclined surface 723 to be arranged at equal intervals in the Y direction.

Positions of the plurality of openings 722a provided at the one upper inclined surface 722 and positions of the plurality of openings 722a provided at the other upper inclined surface 722 are preferably misaligned with each other in the Y direction. Further, positions of the plurality of openings 723a provided at the boundary portions between the one upper inclined surface 722 and the one lower inclined surface 723, and positions of the plurality of openings 723a provided at the boundary portion between the other upper inclined surface 722 and the other lower inclined surface 723 are preferably misaligned with each other in the Y direction.

A plurality of openings 724a are provided at each lower inclined surface 723 so as to be arranged at equal intervals in the Y direction, and a plurality of openings 725a are provided at lower positions than the plurality of openings 724a so as to be arranged at equal intervals in the Y direction. A slit-shaped opening 726a is provided to extend in the Y direction between the lower ends of the pair of lower inclined surfaces 723.

As shown in FIG. 11, a pair of connection ports 721c, a pair of connection ports 724c, a pair of connection ports 725c, and a slit-shaped opening 726c are provided at the lower surface of the waiting pod 70.

A pair of gas supply paths 721d is provided so as to extend between the pair of connection ports 721c and the plurality of openings 721a, 722a, 723a. The one gas supply path 721d extends between the one connection port 721c and the plurality of openings 721a, 722a, 723a provided at the one side surface 721, the upper inclined surface 722 and the lower inclined surface 723. The other gas supply path 721d extends between the other connection port 721c and the plurality of openings 721a, 722a, 723a provided at the other side surface 721, the upper inclined surface 722 and the lower inclined surface 723.

Each gas supply path 721d includes a supply path 721x, a plurality of supply paths 721b, a plurality of supply paths 722b and a plurality of supply paths 723b. The supply path 721x is provided to extend upward from each connection port 721c. The plurality of supply paths 721b extend inward horizontally from the upper end of the supply path 721x to be connected to the plurality of openings 721a, respectively. The plurality of supply paths 722b extend obliquely downward inward inside from the supply path 721x to be connected to the plurality of openings 722a, respectively. The plurality of supply paths 723b extend obliquely upward inward from the supply path 721x to be connected to the plurality of openings 723a, respectively.

A pair of cleaning liquid supply paths 724b is provided to respectively extend between one connection port 724c and a plurality of openings 724a of the one lower inclined surface 723, and between the other connection port 724c and the plurality of openings 724a of the other lower inclined surface 723. Each cleaning liquid supply path 724b extends upward from each connection port 724c and is further branched into a plurality of paths to extend inward horizontally, thereby being connected to the plurality of openings 724a.

A pair of drain paths 725b is provided to respectively extend between the one connection port 725c and the plurality of openings 725a of the one lower inclined surface 723, and between the other connection port 725c and the plurality of openings 725a of the other lower inclined surface 723. Each drain path 725b extends upward from each connection port 725c and is further branched into the plurality of paths to extend inward horizontally, thereby being connected to the plurality of openings 725a. The drain path 726b is provided to extend between the opening 726a and the opening 726c.

While the openings 721a, 722a, 723a, 724a, 725a are not actually positioned in the common plane vertical to the Y direction as shown in FIGS. 10A and 10B, the opening 721a, 722a, 723a, 724a, 725a are shown to be positioned in the common plane vertical to the Y direction in FIG. 11, and FIGS. 13A, 13B and 14 described below for simplification. Similarly, the connection ports 721c, 724c, 725c, the supply paths 721x, 721b, 722b, 723b, the cleaning liquid supply path 724b and the drain path 725b are shown to be positioned in the common plane vertical to the Y direction.

The supply pipe 702f extending from the gas supply source 704 of FIG. 9 is connected to the pair of connection ports 721c. The gas is introduced into each gas supply path 721d of the waiting pod 70 from the gas supply source 704 through the supply pipe 702f. The introduced gas is discharged from the plurality of openings 721a, 722a, 723a.

The supply pipe 702e extending from the cleaning liquid supply source 703 of FIG. 9 is connected to the pair of connection ports 724c. The cleaning liquid is introduced into each cleaning liquid supply path 724b of the waiting pod 70 from the cleaning liquid supply source 703 through the supply pipe 702e. The introduced cleaning liquid is discharged from the plurality of openings 724a.

The drain pipe 705b extending from the suction device 705 of FIG. 9 is connected to the pair of connection ports 725c. The cleaning liquid and the removed contaminants are sucked in by the suction device 705 through the drain path 725b and the drain pipe 705b. The sucked-in cleaning liquid and the contaminants are led to the drain (not shown) to be drained.

As shown in FIG. 12, the upper end of each end wall 727 is lower than the upper end of each sidewall 721. A cutout 727a for draining the cleaning liquid containing gas bubbles is provided at each end wall 727 to extend along the one sidewall 721. Further, a cutout 727b for positioning the slit nozzle 61 is provided between the cutout 727a and the other sidewall 721 at the one end wall 727.

The surface of each end wall 727 facing the groove 720 (hereinafter referred to as an inner surface) is provided with a plurality of (two in this example) openings 727c (FIG. 11). The plurality of openings 727c are provided on the same height as the plurality of openings 722a of the upper inclined surface 722, for example. A supply path 727d is provided to extend from each opening 727c. Each supply path 727d communicates with the supply path 721x of FIG. 11. Thus, part of the gas introduced into each gas supply path 721d through the supply pipe 702f from the gas supply source 704 of FIG. 11 is discharged from the opening 727c through the supply path 727d.

(2-2) Cleaning Processing

Figure 13A:
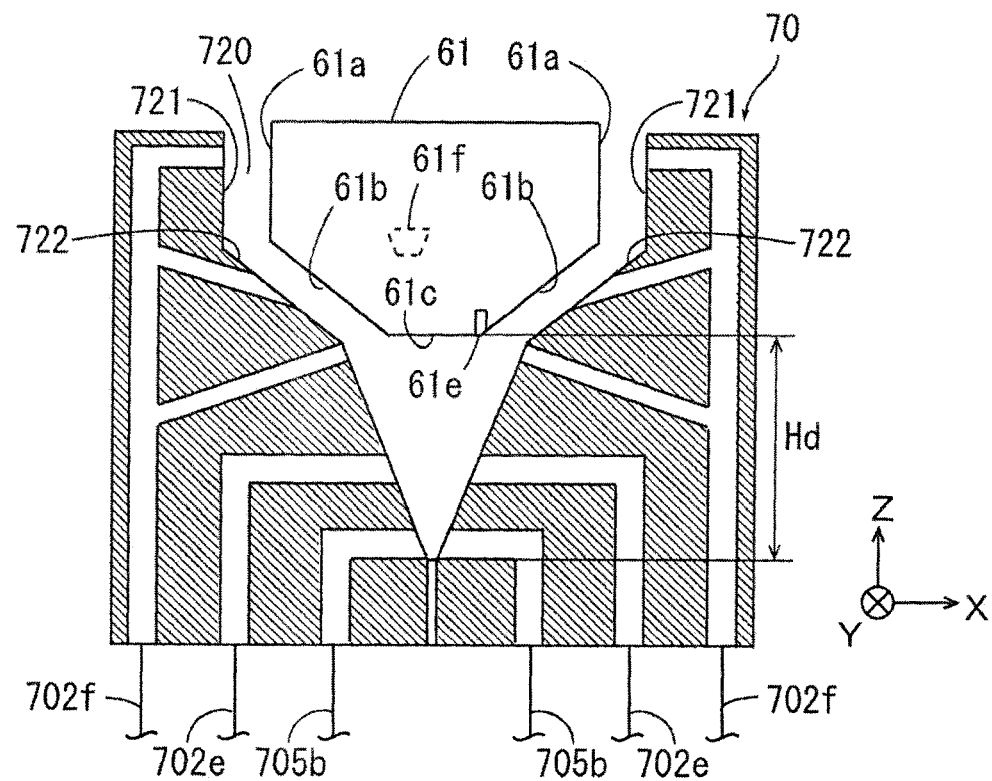
FIGS. 13A and 13B are schematic cross sectional views for explaining the cleaning processing in the waiting pod.
Figure 13B:
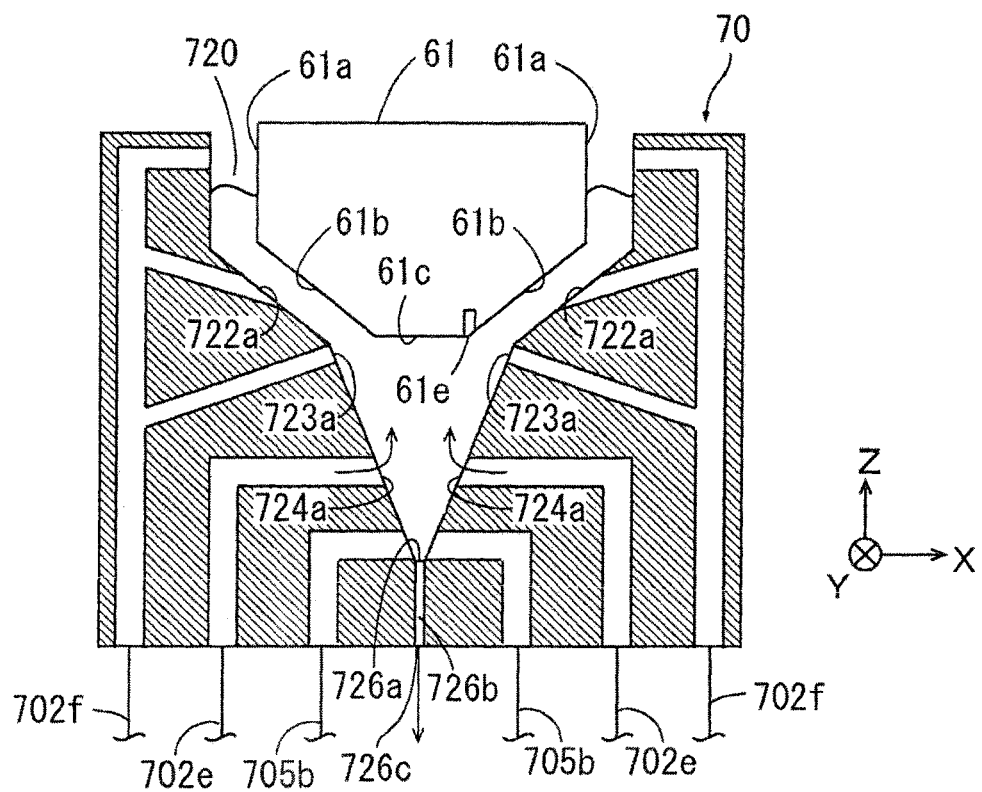
Figure 14:
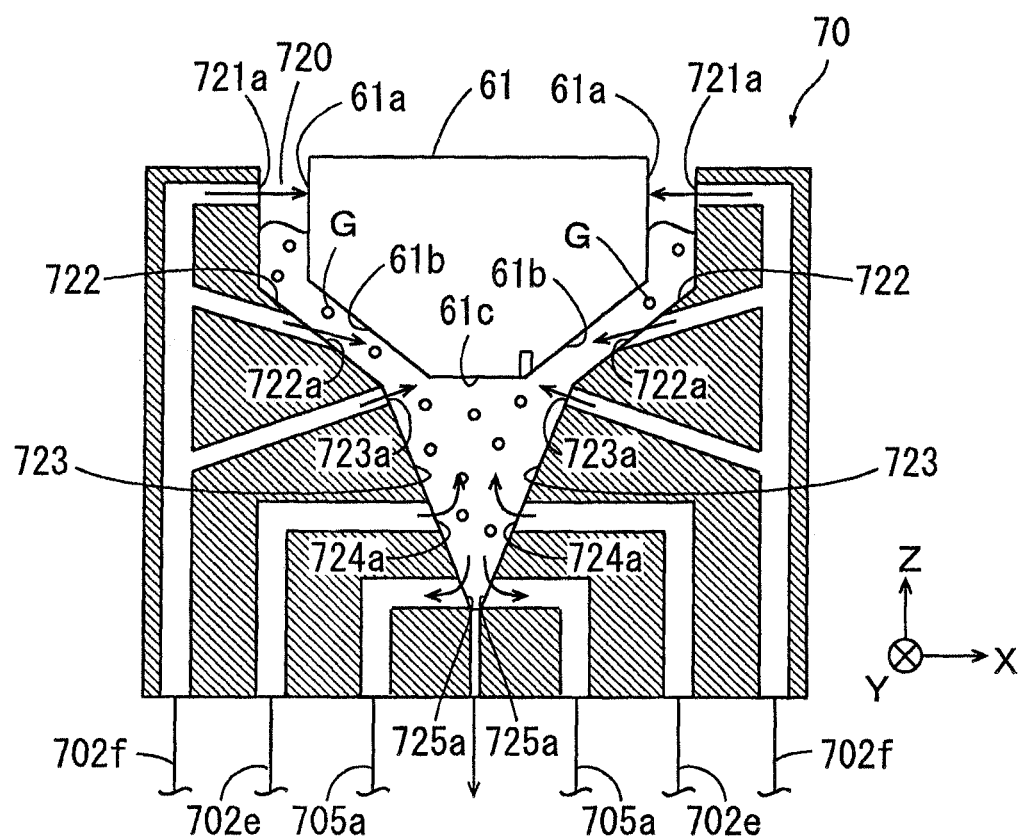
FIG. 14 is a schematic cross sectional view for explaining the cleaning processing in the waiting pod.

Description will be made of the cleaning processing in the waiting pod 70 of FIGS. 9 to 12. FIGS. 13A, 13B and 14 are schematic cross sectional views for explaining the cleaning processing in the waiting pod 70 of FIGS. 9 to 12. First, as shown in FIGS. 13A and 13B, the lower part of the slit nozzle 61 including at least the inclined surfaces 61b and the bottom surface 61c is contained in the groove 720 of the waiting pod 70. In this case, the pair of the side surfaces 721 of the groove 720 are respectively opposite to the pair of side surfaces 61a of the slit nozzle 61, and the pair of upper inclined surfaces 722 of the groove 720 are respectively opposite to the pair of inclined surfaces 61b of the slit nozzle 61. Further, the inner surfaces of the pair of end walls 727 (FIG. 12) are respectively opposite to the pair of end walls 61d of the slit nozzle 61 (FIG. 9).

Further, a projection 61f is provided at the one end surface 61d of the slit nozzle 61. When the slit nozzle 61 is contained in the groove 720 of the waiting pod 70, the projection 61f is fitted in the cutout 727b of the end wall 727 of FIG. 12. Thus, the slit nozzle 61 is accurately positioned in the waiting pod 70.

In the present embodiment, a shape of the groove 720, a height of the projection 61f and the cutout 727b and the like are set such that a difference Hd in height between the lower surface 61c of the slit nozzle 61 and the bottom part of the groove 720 (the lower end of the lower inclined surfaces 723) while the slit nozzle 61 is positioned is not less than 5 mm.

Next, as shown in FIG. 13B, the cleaning liquid is discharged from the plurality of opening 724a of the groove 720. In this case, when a liquid surface of the cleaning liquid in the groove 720 gradually rises and reaches the lower end of the cutout 727a of each end wall 727 (FIG. 12), the cleaning liquid flows out to the outside of the waiting pod 70 from the cutouts 727a. Further, the cleaning liquid flows out from the opening 726a at the bottom part of the groove 720 by its own weight through the drain path 726b and the opening 726c. The cleaning liquid that flows out from the cutouts 727a and the opening 726a is led to the drain (not shown).

When an amount of the cleaning liquid flowing out from the cutouts 727a (FIG. 12) and the opening 726a becomes equal to an amount of the cleaning liquid discharged from the openings 724a, the liquid surface of the cleaning liquid in the groove 720 is kept at a substantially constant height. An amount of the supply of the cleaning liquid, the size of the opening 726a, the size and the height of the cutouts 727a and the like are adjusted such that the height of the liquid surface of the cleaning liquid in the groove 720 can be adjusted. In this example, the height of the liquid surface of the cleaning liquid is adjusted to be higher than that of the lower surface 61c of the slit nozzle 61. Further, the height of the liquid surface of the cleaning liquid is adjusted to be higher than that of the plurality of openings 722a, 727c and lower than that of the plurality of openings 721a.

Thus, the cleaning liquid is stored in the groove 720 such that at least part of the inclined surfaces 61b and the entire lower surface 61c of the slit nozzle 61 are kept dipped in the cleaning liquid. Therefore, the contaminants relatively weakly adhering to the inclined surfaces 61b and the lower surface 61c of the slit nozzle 61 can be removed. Further, the cleaning liquid continues to be supplied and drained such that a flow of the cleaning liquid is formed. The contaminants can be removed from the slit nozzle 61 by its flowing forces. Further, the cleaning liquid continues to be supplied and drained, so that the cleaning liquid in the groove 720 is kept clean. Therefore, the removed contaminants are prevented from adhering again to the slit nozzle 61.

Further, contaminants are easily concentrated at a location where the cleaning liquid is drained from the groove 720 due to an overflow. Therefore, the removed contaminants may adhere again to the slit nozzle 61 in the vicinity of the location where draining is caused by the overflow. In this example, the locations where the cleaning liquid is drained by the overflow are limited to the cutouts 727a (FIG. 12) at the both ends of the groove 720, and the cleaning liquid is not drained due to the overflow from other locations. Therefore, the removed contaminants are prevented from adhering again to the location other than the both ends of the slit nozzle 61. Further, a length of the slit nozzle 61 in the longitudinal direction (the Y direction) is larger than that of a diameter of the substrate W, so that the both ends of the slit nozzle 61 do not pass over the substrate W. Therefore, even if the contaminants adhere again to the both ends of the slit nozzle 61, the development defects and the like of the substrate W caused by the contaminants do not occur. Further, because the contaminants are concentrated at the vicinity of the cutouts 727a, the waiting pod 70 can be efficiently maintained and the waiting pod 70 is easily managed.

Next, as shown in FIG. 14, gas is discharged from the plurality of openings 721a, 722a, 723a of the groove 720 and the openings 727c of FIG. 12. Therefore, the gas discharged from the openings 722a, 723a, 727c is mixed in the cleaning liquid in the groove 720 as the gas bubbles G.

In this case, the gas bubbles G formed by the gas discharged from the openings 722a, 723a, 727c collide with the inclined surfaces 61b of the slit nozzle 61, and the gas bubbles G formed by the gas discharged from the openings 727c (FIG. 12) collide with the end surfaces 61d of the slit nozzle 61 (FIG. 9). Further, the gas bubbles G mixed therein move to a position below the slit nozzle 61 and collide with the lower surface 61c. Thus, the contaminants adhering to the inclined surfaces 61b, the lower surface 61c and the end surfaces 61d of the slit nozzle 61 are removed by the colliding forces of the gas bubbles G. Further, the contaminants adhering the inclined surfaces 61b, the lower surface 61c and the end surfaces 61d of the slit nozzle 61 are broken up by the pressure wave generated by the movement, collision and the like of the gas bubbles G. Further, the gas bubbles G adhere to the contaminants and strip the contaminants off the inclined surfaces 61b, the lower surface 61c and the end surfaces 61d of the slit nozzle 61.

Further, the plurality of gas bubbles G move dispersively in different directions in a gap between the upper inclined surfaces 722 of the groove 720 and the inclined surfaces 61b of the slit nozzle 61, a gap between the inner surfaces of the end walls 727 (FIG. 12) and end surfaces 61d of the slit nozzle 61 (FIG. 9) and a region between the lower inclined surfaces 723 of the groove 720 and the lower surfaces 61c of the slit nozzle 61 by repeating to collide, burst and unite. Thus, the inclined surfaces 61b, the lower surface 61c and the end surfaces 61d of the slit nozzle 61 can be uniformly cleaned.

Further, positions of the plurality of openings 722a provided at the one upper inclined surface 722 and the positions of the plurality of openings 722a provided at the other upper inclined surface 722 are set to misalign with each other in the Y direction such that the gas bubbles G are efficiently dispersed in the Y direction. Similarly, positions of the plurality of openings 723a provided at the boundary portion between the one upper inclined surface 722 and the one lower inclined surface 723, and position of the plurality of openings 723a provided at the boundary portion between the other upper inclined surface 722 and the other lower inclined surface 723 are set to misalign with each other in the Y direction such that the gas bubbles G are efficiently dispersed in the Y direction. Therefore, the inclined surfaces 61b and the lower surface 61c of the slit nozzle 61 can be more uniformly cleaned.

Furthermore, because the plurality of openings 721a are positioned higher than the liquid surface of the cleaning liquid, the gas is discharged from the plurality of openings 721a such that a flow of gas is formed above the liquid surface of the cleaning liquid in the substantially horizontal direction. This flow of gas cuts off the space in the groove 720 from the outside of the groove 720. Thus, the cleaning liquid is prevented from splashing to the outside of the waiting pod 70. Therefore, the cleaning liquid is prevented from adhering to the substrate W on the spin chuck 11, the substrate W during being transported and the like.

The suction device 705 of FIG. 9 operates at the time of the discharge of the gas from the openings 722a, 723a, 727c. This causes part of the cleaning liquid and the removed contaminants to be sucked in from the plurality of openings 725a and discharged. Therefore, a re-adherence of the removed contaminants to the inclined surfaces 61b, the lower surface 61c and the end surfaces 61d of the slit nozzle 61 (FIG. 9) is suppressed.

After a certain time period is elapsed since the discharge of the gas is started, the discharge of the gas from the openings 721a, 722a, 723a, 727c is stopped and the discharge of the cleaning liquid from the openings 724a is stopped. In this case, the cleaning liquid flows out from the cutouts 727a (FIG. 12) and the opening 726a and the cleaning liquid is sucked in from the openings 725a by the suction device 705, whereby the liquid surface of the cleaning liquid in the groove 720 is gradually lowered and substantially all of the cleaning liquid is removed from the groove 720. Thereafter, the operation of the suction device 705 is stopped. Thus, the cleaning processing for the slit nozzle 61 is completed.

(2-3) Drop of the Cleaning Liquid

If the cleaning liquid is held between the lower surface 61c of the slit nozzle 61 and the inner surfaces of the groove 720 when the cleaning liquid is drained from the groove 720, the cleaning liquid remains without being drained until the slit nozzle 61 is retracted from the waiting pod 70. Therefore, the slit nozzle 61 may be moved to a position over the substrate W from the waiting pod 70 with a large droplet of the cleaning liquid being adhering to the lower surface 61c.

In this case, the cleaning liquid being adhering to the slit nozzle 61 may drop on the substrate W and the development defects of the substrate W may occur. In particular, when the slit nozzle 61 is moved from the waiting pod 70c of FIG. 3 to the development processing unit DEV1 through above the development processing units DEV2, DEV3, the cleaning liquid may drop on any of the substrates W in the development processing units DEV1, DEV2, DEV3 from the slit nozzle 61. Therefore, the cleaning liquid may adhere to the substrate W after being dried, for example.

Further, if foreign matters are included in the cleaning liquid being adhering to the slit nozzle 61, the foreign matter may be fixed on the slit nozzle 61. In this case, discharge direction and the like of the development liquid may be changed due to the foreign matters fixed on the slit nozzle 61 and the liquid layer of the development liquid may not be appropriately formed on the substrate W.

In the present embodiment, when the cleaning liquid is drained from the groove 720, the cleaning liquid adhering to the inclined surfaces 61b of the slit nozzle 61 moves to the lower surface 61c via the inclined surfaces 61b. The cleaning liquid adhering to the lower surface 61c of the slit nozzle 61 drops on the lower inclined surfaces 723 by its own weight, and then moves downward via the lower inclined surfaces 723 thereby being drained through the opening 726a.

Thus, the cleaning liquid is not held between the lower surface 61c of the slit nozzle 61 and the lower inclined surfaces 723 of the groove 720. Therefore, when the slit nozzle 61 is retracted from the groove 720 of the waiting pod 70, a large droplet of the cleaning liquid is prevented from adhering to the lower surface 61c of the slit nozzle 61. Therefore, when the slit nozzle 61 is moved over the substrate W, the cleaning liquid is prevented from dropping on the substrate W from the slit nozzle 61. Further, the foreign matters included in the cleaning liquid are prevented from being fixed on the slit nozzle 61. As a result, the development defects of the substrate W are prevented.

Further, in the present embodiment, the difference Hd in height between the lower surface 61c of the slit nozzle 61 and the bottom of the groove 720 (the lower ends of the lower inclined surfaces 723) (FIG. 13A) while the slit nozzle 61 is positioned is not less than 5 mm. Thus, the cleaning liquid is more reliably prevented from being held between the lower surface 61c of the slit nozzle 61 and the lower inclined surfaces 723.

Here, the following evaluation was performed in order to confirm that the effect described above is depended on the difference in height between the lower surface 61c of the slit nozzle 61 and the bottom of the groove 720 (hereinafter referred to as a clearance under the nozzle).

The clearance under the nozzle Hd were set to 4 mm, 5 mm, 6 mm and 7 mm, respectively and the cleaning processing was performed as described above. Thereafter, whether or not the cleaning liquid is held between the lower surface 61c of the slit nozzle 61 and the lower inclined surfaces 723 was examined. Pure water was used as the cleaning liquid and an amount of the supply of the cleaning liquid was set to 0.6 L/mim in the respective cases.

As a result, in the cases where the clearance under the nozzle Hd was set to 5 mm, 6 mm and 7 mm, the cleaning liquid did not drop in the groove 720 from the slit nozzle 61 when the slit nozzle 61 was retracted from the groove 720. This means that the cleaning liquid was not held between the lower surface 61c and the lower inclined surfaces 723 of the slit nozzle 61. On the other hand, in the case where the clearance under the nozzle Hd was set to 4 mm, a splash was observed when the slit nozzle 61 was retracted from the groove 720. It is conceivable that the lower surface 61c of the slit nozzle 61 was moved away from the lower inclined surfaces 723, causing the cleaning liquid held between the lower surface 61c of the slit nozzle 61 and the lower inclined surfaces 723 to be separated, whereby such a state was occurred.

Thus, it was understood that the cleaning liquid is reliably prevented from being held between the lower surface 61c of the slit nozzle 61 and the lower inclined surfaces 723 by setting the clearance under the nozzle Hd to not less than 5 mm. Therefore, the clearance under the nozzle Hd is set to not less than 5 mm such that the drop of the cleaning liquid on the substrate W and the fixation of the foreign matters on the slit nozzle 61 are more reliably prevented. As a result, the development defects of the substrate W are more reliably prevented.

Further, in the present embodiment, because the cross sectional area of the groove 720 is set to gradually become smaller from the upper ends to the lower end of the groove 720, the clearance under the nozzle Hd can be sufficiently ensured while an increase in size of the waiting pod 70 is suppressed.

Note that, if the shape of the slit nozzle 61, the shape of the groove 720, the type of the cleaning liquid and the like are different from the examples described above, the clearance under the nozzle Hd which can prevent the cleaning liquid from being held between the lower surface 61c of the slit nozzle 61 and the inner surfaces of the groove 720 may be different from the examples described above. Therefore, if the cleaning liquid is prevented from being held between the lower surface 61c of the slit nozzle 61 and the inner surfaces of the groove 720 in another condition, the clearance under the nozzle Hd may be less than 5 mm.

(2-4) Effects

In such a way, also in the development processing device 1 according to the present embodiment, after the development liquid is discharged on the substrate W from the slit nozzle 61, the cleaning processing for the slit nozzle 61 is performed in the waiting pod 70 using the cleaning liquid with the gas bubbles mixed therein. Thus, the slit nozzle 61 can be cleaned. As a result, the development defects of the substrate W caused by the contamination of the slit nozzle 61 can be prevented.

Further, in the present embodiment, the cleaning liquid is stored in the groove 720 while part of the slit nozzle 61 is contained in the groove 720, and the gas discharged from the openings 722a, 723a, 727c is mixed as the gas bubbles in the stored cleaning liquid. Thus, because part of the slit nozzle 61 is kept dipped in the cleaning liquid with the gas bubbles mixed therein, the contaminants adhering the slit nozzle 61 can be effectively removed. Therefore, the slit nozzle 61 can be efficiently cleaned.

Further, in the development processing device 1 according to the present embodiment, the lower inclined surfaces 723 of the groove 720 are formed such that the cleaning liquid is not held between the lower surface 61c of the slit nozzle 61 and the lower inclined surfaces 723 of the groove 720 after the cleaning liquid is drained from the groove 720 of the waiting pod 70.

Thus, when the slit nozzle 61 is retracted from the groove 720, a large droplet of the cleaning liquid is prevented from adhering to the lower surface 61c of the slit nozzle 61. Therefore, when the slit nozzle 61 is moved over the substrate W, the cleaning liquid is prevented from dropping on the substrate W from the slit nozzle 61. Further, the foreign matters included in the cleaning liquid are prevented from being fixed on the slit nozzle 61. As a result, the development defects of the substrate W are prevented.

(2-5) Modified Example of the Waiting Pod (2-5-1)

Positions, numbers, sizes, shapes and the like of the openings 721a, 722a, 723a, 724a, 725a, 726a, 727c are not limited to the example described above and may be suitably changed. For example, the plurality of openings 721a, 722a, 723a, 724a, 725a, 727c may be respectively provided in multiple stages, or the plurality of openings 726a may be formed in parallel with each other. Further, each of the openings 721a, 722a, 723a, 724a, 725a, 727c may be slit-shaped, and the plurality of circular openings 726a may be provided to be arranged in the Y direction.

(2-5-2)

Figure 15A:
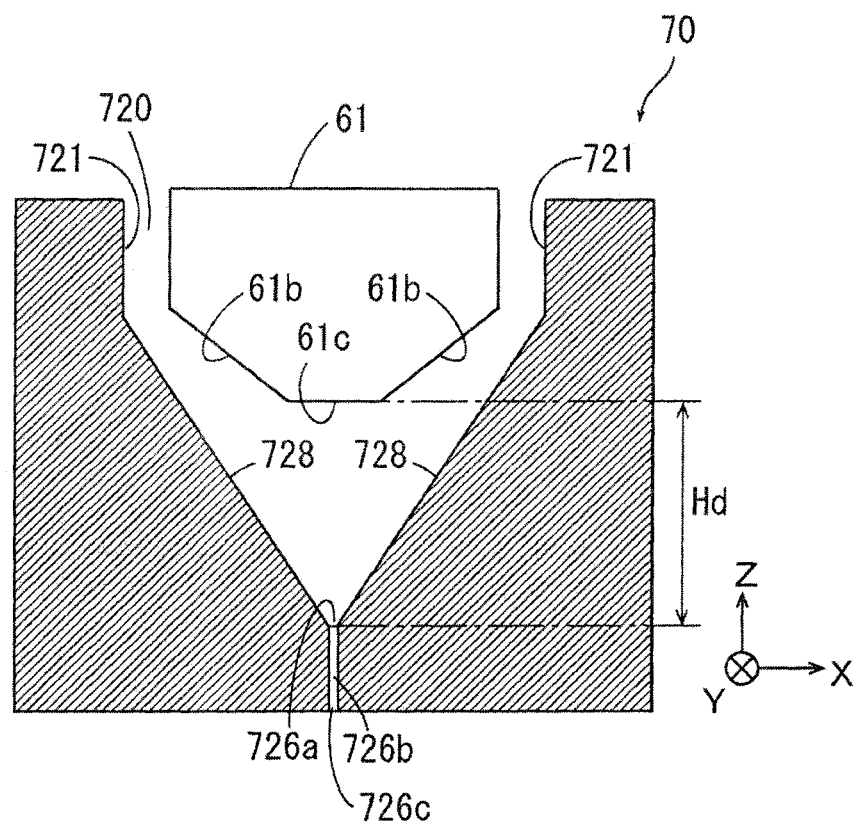
FIGS. 15A and 15B are schematic cross sectional views showing other shapes of a groove.
Figure 15B:
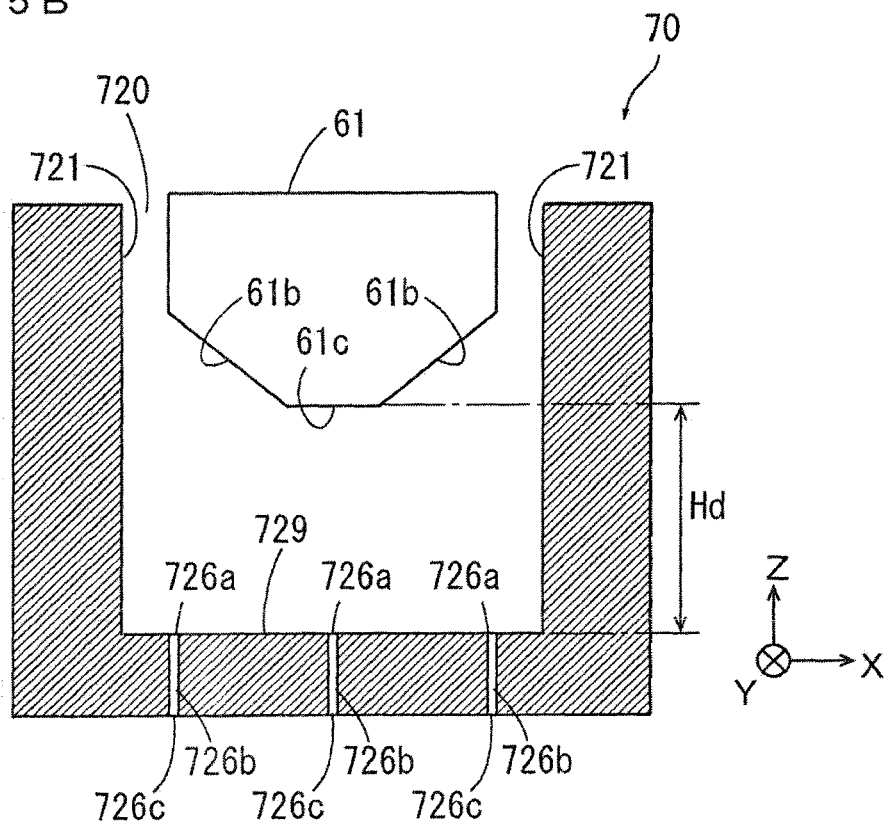

The shape of the groove 720 is not limited to the example described above. FIGS. 15A and 15B are schematic cross sectional views showing another shape of the groove 720. The openings 721a, 722a, 723a, 724a, 725a, the connection ports 721c, 724c, 725c, the gas supply path 721d, the cleaning liquid supply path 724b and the drain path 725b are not shown in FIGS. 15A and 15B.

In the example of FIG. 15A, a pair of inclined surfaces 728 is provided instead of the pair of upper inclined surfaces 722 and the pair of lower inclined surfaces 723. The pair of inclined surfaces 728 extends obliquely downward to come close to each other from the lower ends of the pair of side surfaces 721. The opening 726a is provided between the lower ends of the pair of inclined surfaces 728.

The pair of inclined surfaces 728 is provided such that the cleaning liquid is not held between the lower surface 61c of the slit nozzle 61 and the inclined surfaces 728 of the groove 720 after the cleaning liquid is drained from the groove 720 of the waiting pod 70. Further, the difference Hd in height between the lower surface 61c of the slit nozzle 61 and the bottom of the groove 720 (the lower ends of the lower inclined surfaces 728) while the slit nozzle 61 is positioned in the groove 720 is preferably not less than 5 mm.

In the example of FIG. 15B, a length of the pair of side surfaces 721 is set to be larger than the example described above, and a bottom surface 729 is provided instead of the pair of upper inclined surfaces 722 and the pair of lower inclined surfaces 723. The plurality of openings 726a are provided at the bottom surface 729.

The pair of side surfaces 721 and the bottom surface 729 are provided such that the cleaning liquid is not held between the lower surface 61c of the slit nozzle 61 and the bottom surface 729 of the groove 720 after the cleaning liquid is drained from the groove 720 of the waiting pod 70. Further, the difference Hd in height between the lower surface 61c of the slit nozzle 61 and the bottom of the groove 720 (the bottom surface 729) while the slit nozzle 61 is positioned is preferably not less than 5 mm.

In the examples of FIGS. 15A and 15B, when the slit nozzle 61 is retracted from the groove 720, a large droplet of the cleaning liquid is prevented from adhering to the lower surface 61c of the slit nozzle 61. Thus, when the slit nozzle 61 is moved over the substrate W, the cleaning liquid is prevented from dropping on the substrate W from the slit nozzle 61 after the cleaning processing. Further, the foreign matters included in the cleaning liquid are prevented from being fixed on the slit nozzle 61. As a result, the development defects of the substrate W are prevented.

(2-5-3)

If a necessary amount of the cleaning liquid can be supplied, the openings 724a may be provided only at the one lower inclined surface 723. Further, if a necessary amount of gas bubbles can be mixed in the stored cleaning liquid, at least one of the openings 722a, 723a, 727c do not have to be provided. Further, if the cleaning liquid can be or does not need to be prevented from splashing to the outside of the waiting pod 70, the openings 721a do not have to be provided.

(2-5-4)

While the openings 722a, 723a, 727c for discharging the gas are provided at the upper inclined surfaces 722 and the end walls 727 in the second embodiment, openings for discharging the gas may be provided at the lower inclined surfaces 723 instead of the openings 722a, 723a, 727c or in addition to the openings 722a, 723a, 727c. Further, while the openings 724a for discharging the liquid are provided at the lower inclined surfaces 723 in the second embodiment, openings for discharging the cleaning liquid may be provided at the upper inclined surfaces 722 instead of the openings 724a or in addition to the openings 724a.

(2-5-5)

Though the suction is performed by the suction device 705 when the gas is discharged from the openings 721a, 722a, 723a, 727c in the second embodiment, the suction may be performed by the suction device 705 also before the gas is discharged from the openings 721a, 722a, 723a, 727c and when the cleaning liquid is discharged from the openings 724a. In this case, the removed contaminants can be more reliably prevented from adhering again to the slit nozzle 61. Further, if the contaminants can or do not need to be prevented from adhering again, the suction does not have to be performed by the suction device 705. In this case, the openings 725a do not need to be provided and the draining may only be performed from the opening 726a and the cutouts 727a.

(2-5-6)

While the cleaning liquid is drained from the opening 726a by its own weight in the second embodiment, the cleaning liquid may be sucked in from the opening 726a by the suction device 705. Further, if the cleaning liquid can or does not need to be prevented from remaining in the groove 720, the opening 726a does not need to be provided and the draining may only be performed from the openings 725a and the cutouts 727a.

(2-5-7)

While the cutouts 727a are provided at the both end walls 727 in the second embodiment, the cutout 727a may be provided at the only one of the end walls 727. Further, if the slit nozzle 61 can be cleaned, the cleaning liquid may be flowed out from another location in the groove 720.

(2-5-8)

While the gas is discharged from the openings 722a, 723a, 727c and the cleaning liquid is discharged from the openings 724a in the second embodiment, the gas mixing device for mixing the gas in the cleaning liquid may be separately provided similarly to the first embodiment described above, and the cleaning liquid in which the gas is mixed in the gas mixing device (cleaning liquid containing gas) may be discharged from at least one of the openings 722a, 723a, 727c, 724a. Further, an opening for discharging the cleaning liquid containing gas may be separately provided.

(2-5-9)

While the cleaning liquid is stored in the groove 720 and the gas bubbles are mixed in the stored cleaning liquid such that the slit nozzle 61 is cleaned in the second embodiment, the cleaning method for the slit nozzle 61 is not limited to this. For example, part of the slit nozzle 61 is dipped in the stored cleaning liquid without having the gas bubbles be mixed in the cleaning liquid such that the slit nozzle 61 may be cleaned. Alternatively, the cleaning liquid is sprayed on the slit nozzle 61 without having the cleaning liquid be stored in the groove 720 such that the slit nozzle 61 may be cleaned. Further alternatively, the cleaning liquid with gas bubbles mixed therein is sprayed on the slit nozzle 61 such that the slit nozzle 61 may be cleaned.

(3) Another Embodiment

The first and second embodiments described above are examples in which the present invention is applied to the development processing device including the slit nozzle 61 having the slit-shaped discharge port 61e, the invention is not limited to this. The present invention may be applied to the development processing device including the development liquid nozzle having one or a plurality of small holes for discharging the development liquid. Also in this case, similarly to the first and second embodiments described above, the cleaning processing for the development liquid nozzle is performed using the cleaning liquid with the gas bubbles mixed therein such that the development liquid nozzle can be cleaned. Thus, the development defects of the substrate W caused by the contamination of the nozzle for the development liquid can be prevented.

Further, similarly to the second embodiment described above, the inner surface of a container is formed such that the cleaning liquid is not held between the lower surface of the development liquid nozzle and the inner surfaces of the container, whereby the cleaning liquid is prevented from dropping on the substrate W from the development liquid nozzle after the cleaning processing when the development liquid nozzle is moved over the substrate W. Further, the foreign matters included in the cleaning liquid are prevented from being fixed on the development liquid nozzle. Thus, the development defects of the substrate W are prevented.

(4) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the embodiments described above, the development processing device 1 is an example of a development processing device, the spin chuck 11 is an example of a substrate holder, the slit nozzle 61 is an example of a development liquid nozzle, the lower surface 61c is an example of a lower surface, the discharge port 61e is an example of a development liquid discharge port, the cleaning processor 700 is an example of the cleaning processor and the nozzle lifting/lowering mechanism 62 and the nozzle sliding mechanism 63 are examples of a moving device.

Further, the gas bubbles mixing device 702 is an example of the claimed gas bubbles mixer, the waiting pod 70 is an example of the claimed cleaning liquid supplier, the groove 710 is an example of the claimed container and the claimed groove, the opening 712a is an example of the claimed cleaning liquid discharge port and the claimed opening, the Y direction is an example of one direction in the claims, the side surface 711, the inclined surface 712 and the bottom surface 713 are examples of the claimed inner surface, the outflow portion 715 is an example of the claimed outflow portion, the opening 713a is an example of the claimed drain port and the suction device 705 is an example of the claimed suction device. Further, the groove 720 is an example of the claimed storage, the claimed container and the claimed groove, and the openings 722a, 723a are examples of the claimed gas bubbles mixer, the claimed gas discharge port and the claimed first gas discharge port, the side surface 721, the upper inclined surface 722 and the lower inclined surface 723 are examples of the claimed inner surface, the opening 724a is an example of the claimed cleaning liquid discharge port, the claimed cleaning liquid supplier and the claimed cleaning liquid discharge port. Further, the opening 726a is an example of the claimed drain and the claimed drain port, the lower inclined surface 723 is an example of the claimed inclined surface, the cutout 727a is an example of the claimed outflow portion and the opening 721a is an example of the claimed second gas discharge port.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A nozzle cleaning method comprising:
    discharging a development liquid from a development liquid discharge port of a development liquid nozzle to a substrate held by a substrate holder while moving the development liquid nozzle relative to the substrate held by the substrate holder;
    moving the development liquid nozzle to a waiting position excluding a position over the substrate held by the substrate holder; and
    performing cleaning processing for the development liquid nozzle by a cleaning processor provided at the waiting position, wherein
    the cleaning processor includes a container capable of storing a cleaning liquid,
    the container has a first inner surface, a second inner surface, and a bottom,
    the first inner surface of the container is provided with a first cleaning liquid discharge port and a first gas discharge port, and the second inner surface of the container is provided with a second cleaning liquid discharge port and a second gas discharge port,
    the container has first and second gas supply paths that extend obliquely downward so as to come toward each other inwardly and communicate with the first and second gas discharge ports, respectively,
    the development liquid nozzle has first and second outer surfaces and a lower surface that connects the first outer surface and the second outer surface, the first and second outer surfaces being positioned on opposite sides with respect to the lower surface, the development liquid discharge port being provided at the lower surface, the first and second outer surfaces extending obliquely downwardly toward the lower surface so as to approach each other, and
    the performing of the cleaning processing includes:
        containing at least part of the development liquid nozzle in the container in which the cleaning liquid is not stored such that at least part of the first outer surface, at least part of the second outer surface, and the lower surface of the development liquid nozzle are opposite to the first inner surface, the second inner surface, and the bottom of the container, respectively,
        after containing the at least part of the development liquid nozzle in the container, supplying the cleaning liquid from the first cleaning liquid discharge port into the container to store the cleaning liquid in the container such that the lower surface of the development liquid nozzle is at a position lower than a liquid surface of the cleaning liquid stored in the container, and the first and second gas discharge ports are at positions lower than the liquid surface of the cleaning liquid stored in the container,
        after storing the cleaning liquid in the container, repeating the supplying of the cleaning liquid into the container and draining of the cleaning liquid from a drain port provided at the bottom of the container to form a flow of the cleaning liquid in the container, and
        after storing the cleaning liquid in the container, discharging gas obliquely downward toward the first and second outer surfaces from the first and second gas discharge ports through the first and second gas supply paths to mix gas bubbles in the cleaning liquid and also cause the gas bubbles to collide with the first and second outer surfaces of the development liquid nozzle.

2. The nozzle cleaning method according to claim 1, wherein
    the first and second outer surfaces and the lower surface of the development liquid nozzle extend in one direction,
    the container includes a groove capable of containing the at least part of the development liquid nozzle,
    the groove having the first and second inner surfaces and the bottom, the first and second inner surfaces and the bottom extending in the one direction,
    the first cleaning liquid discharge port includes a plurality of first openings provided to be arranged in the one direction at the first inner surface,
    the second cleaning liquid discharge port includes a plurality of second openings provided to be arranged in the one direction at the second inner surface,
    the first gas discharge port includes a plurality of third openings provided to be arranged in the one direction at the first inner surface, and
    the second gas discharge port includes a plurality of fourth openings provided to be arranged in the one direction at the second inner surface.

3. The nozzle cleaning method according to claim 2, wherein
    lower regions of the first and second inner surfaces extend obliquely downward to the bottom of the groove to come close to each other.

4. The nozzle cleaning method according to claim 2, wherein
    the groove has first and second end walls, and
    the storing of the cleaning liquid in the container includes causing the cleaning liquid which exceeds a certain height in the groove to flow out of the groove from an outflow portion provided at at least one of the first and second end walls while storing the cleaning liquid in a gap between the first inner surface of the groove and the first outer surface of the development liquid nozzle and in a gap between the second inner surface of the groove and the second outer surface of the development liquid nozzle.

5. The nozzle cleaning method according to claim 1, wherein
the first and second gas discharge ports are positioned above the first and second cleaning liquid discharge ports.

6. A nozzle cleaning method comprising:
discharging a development liquid from a development liquid discharge port of a development liquid nozzle to a substrate held by a substrate holder while moving the development liquid nozzle relative to the substrate held by the substrate holder;
moving the development liquid nozzle to a waiting position excluding a position over the substrate held by the substrate holder; and
performing cleaning processing for the development liquid nozzle by a cleaning processor provided at the waiting position, wherein
the development liquid nozzle has first and second outer surfaces and a lower surface that connects the first outer surface and the second outer surface, the first and second outer surfaces and the lower surface extending in one direction, the first and second outer surfaces being positioned on opposite sides with respect to the lower surface, the first outer surface forming a first inclination angle that is an acute angle from a horizontal orientation, and the second outer surface forming a second inclination angle that is an acute angle from the horizontal orientation,
the development liquid discharge port is provided at the lower surface,
the cleaning processor includes a container having a groove capable of storing a cleaning liquid,
the groove having first and second inner surfaces and a bottom extending in the one direction,
a first inclined surface is provided at a lower region of the first inner surface of the groove, and a second inclined surface is provided at a lower region of the second inner surface of the groove, the first and second inclined surfaces extending obliquely downward so as to come close to each other toward the bottom of the groove, the first inclined surface forming a third inclination angle that is an acute angle from the horizontal orientation and is larger than the first inclination angle, the second inclined surface forming a fourth inclination angle that is an acute angle from the horizontal orientation and is larger than the second inclination angle,
the first inner surface of the groove is provided with a first cleaning liquid discharge port and a first gas discharge port,
the second inner surface of the groove is provided with a second cleaning liquid discharge port and a second gas discharge port,
the container has first and second gas supply paths that extend obliquely downward so as to come toward each other inwardly and communicate with the first and second gas discharge ports, respectively, and
the performing of the cleaning processing includes:
containing at least part of the development liquid nozzle in the container in which the cleaning liquid is not stored such that at least part of the first outer surface and at least part of the second outer surface of the development liquid nozzle are opposite to the first inner surface and the second inner surface of the groove, respectively,
after containing the at least part of the development liquid nozzle in the container, supplying a cleaning liquid from the first cleaning liquid discharge port into the groove to store the cleaning liquid in the groove such that the lower surface of the development liquid nozzle is at a position lower than a liquid surface of the cleaning liquid stored in the groove, and the first and second gas discharge ports are at positions lower than the liquid surface of the cleaning liquid stored in the groove,
after storing the cleaning liquid in the container, repeating the supplying of the cleaning liquid into the container and draining of the cleaning liquid from a drain port provided at the bottom of the container to form a flow of the cleaning liquid in the container,
after storing the cleaning liquid in the container, discharging gas obliquely downward toward the first and second outer surfaces from the first and second gas discharge ports through the first and second gas supply paths to mix gas bubbles in the cleaning liquid and also cause the gas bubbles to collide with the first and second outer surfaces of the development liquid nozzle, and
draining the cleaning liquid stored in the groove from a drain port provided at the bottom of the groove, wherein
the cleaning liquid is not held between the lower surface of the development liquid nozzle and the first and second inner surfaces of the groove while the development liquid nozzle is contained in the container, after the cleaning liquid is drained from the drain port.

7. The nozzle cleaning method according to claim 6, wherein
the first cleaning liquid discharge port includes a plurality of first openings provided to be arranged in the one direction at the first inner surface, and
the second cleaning liquid discharge port includes a plurality of second openings provided to be arranged in the one direction at the second inner surface.

8. The nozzle cleaning method according to claim 6, wherein
third and fourth gas discharge ports are provided at the first and second inner surfaces of the groove, respectively, and
the performing of the cleaning processing includes discharging gas from the third and fourth gas discharge ports so as to cover an upper opening of the groove.

9. The nozzle cleaning method according to claim 6, wherein
the containing of the at least part of the development liquid nozzle in the container includes holding the development liquid nozzle such that a difference in height between a lower end of the lower surface of the development liquid nozzle and the bottom of the groove is set to not less than 5 mm.

10. A nozzle cleaning method comprising:
discharging a development liquid from a development liquid discharge port of a development liquid nozzle to a substrate held by a substrate holder while moving the development liquid nozzle relative to the substrate held by the substrate holder;
moving the development liquid nozzle to a waiting position excluding a position over the substrate held by the substrate holder; and
performing cleaning processing for the development liquid nozzle by a cleaning processor provided at the waiting position, wherein
the cleaning processor includes a container capable of storing a cleaning liquid,
the container has a first inner surface, a second inner surface, and a bottom, the first inner surface of the container is provided with a first cleaning liquid discharge port and a first gas discharge port, and the second inner surface of the container is provided with a second cleaning liquid discharge port and a second gas discharge port, the container has first and second gas supply paths that communicate with the first and second gas discharge ports, respectively, the development liquid nozzle has first and second outer surfaces and a lower surface that connects the first outer surface and the second outer surface, the first and second outer surfaces being positioned on opposite sides with respect to the lower surface, the development liquid discharge port being provided at the lower surface, the first and second outer surfaces extending obliquely downward toward the lower surface so as to approach each other, and the performing of the cleaning processing includes:

containing at least part of the development liquid nozzle in the container in which the cleaning liquid is not stored such that at least part of the first outer surface, at least part of the second outer surface, and the lower surface of the development liquid nozzle are opposite to the first inner surface, the second inner surface, and the bottom of the container, respectively, the first gas supply path is directed toward a boundary between the first outer surface and the lower surface of the development liquid nozzle, and the second gas supply path is directed toward a boundary between the second outer surface and the lower surface of the development liquid nozzle, after containing the at least part of the development liquid nozzle in the container, supplying the cleaning liquid from the first cleaning liquid discharge port into the container to store the cleaning liquid in the container such that the lower surface of the development liquid nozzle is at a position lower than a liquid surface of the cleaning liquid stored in the container, and the first and second gas discharge ports are at positions lower than the liquid surface of the cleaning liquid stored in the container, after storing the cleaning liquid in the container, repeating the supplying of the cleaning liquid into the container and draining of the cleaning liquid from the container to form a flow of the cleaning liquid in the container, and after storing the cleaning liquid in the container, discharging gas toward the boundaries of the development liquid nozzle from the first and second gas discharge ports through the first and second gas supply paths to mix gas bubbles in the cleaning liquid and also cause the gas bubbles to collide with the lower surface of the development liquid nozzle.

\* \* \* \* \*